(12) United States Patent
Roset et al.

(10) Patent No.: US 10,871,714 B2
(45) Date of Patent: *Dec. 22, 2020

(54) LITHOGRAPHIC APPARATUS, COVER FOR USE IN A LITHOGRAPHIC APPARATUS AND METHOD FOR DESIGNING A COVER FOR USE IN A LITHOGRAPHIC APPARATUS

(71) Applicant: ASML NETHERLANDS B.V., Veldhoven (NL)

(72) Inventors: Niek Jacobus Johannes Roset, Eindhoven (NL); Nicolaas Ten Kate, Almkerk (NL); Sergei Shulepov, Eindhoven (NL); Raymond Wilhelmus Louis Lafarre, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/920,788

(22) Filed: Mar. 14, 2018

(65) Prior Publication Data

US 2018/0203365 A1 Jul. 19, 2018

Related U.S. Application Data

(63) Continuation of application No. 14/973,421, filed on Dec. 17, 2015, now Pat. No. 9,927,715, which is a (Continued)

(51) Int. Cl.
*G03F 7/20* (2006.01)
(52) U.S. Cl.
CPC .............................. *G03F 7/70341* (2013.01)

(58) Field of Classification Search
CPC .................... G03F 7/70341; G03F 7/70716
See application file for complete search history.

(56) References Cited

U.S. PATENT DOCUMENTS

| 4,509,852 A | 4/1985 | Tabarelli et al. |
| 7,199,858 B2 | 4/2007 | Lof et al. |
| (Continued) | | |

FOREIGN PATENT DOCUMENTS

| CN | 1501175 | 6/2004 |
| CN | 1550905 | 12/2004 |
| (Continued) | | |

OTHER PUBLICATIONS

Chinese Office Action dated Dec. 13, 2012 in corresponding Chinese Patent Application No. 201110064190.X.
(Continued)

*Primary Examiner* — Deoram Persaud
(74) *Attorney, Agent, or Firm* — Pillsbury Winthrop Shaw Pittman, LLP

(57) ABSTRACT

A lithographic apparatus having a fluid handling structure configured to contain immersion fluid in a space adjacent to an upper surface of a substrate table and/or a substrate located in a recess of the substrate table, a cover including a planar main body that, in use, extends around a substrate from the upper surface to a peripheral section of an upper major face of the substrate in order to cover a gap between an edge of the recess and an edge of the substrate, and an immersion fluid film disruptor configured to disrupt the formation of a film of immersion fluid between an edge of the cover and immersion fluid contained by the fluid handling structure during movement of the substrate table relative to the fluid handling structure.

20 Claims, 15 Drawing Sheets

Related U.S. Application Data continuation of application No. 13/047,165, filed on Mar. 14, 2011, now abandoned.

(60) Provisional application No. 61/388,923, filed on Oct. 1, 2010, provisional application No. 61/346,213, filed on May 19, 2010, provisional application No. 61/314,266, filed on Mar. 16, 2010.

(56) References Cited

U.S. PATENT DOCUMENTS

| | | |
|---|---|---|
| 7,213,963 B2 | 5/2007 | Lof et al. |
| 7,227,619 B2 | 6/2007 | Zaal et al. |
| 7,352,434 B2 | 4/2008 | Streefkerk et al. |
| 7,372,541 B2 | 5/2008 | Lof et al. |
| 7,684,008 B2 | 3/2010 | De Smit et al. |
| 8,144,305 B2 | 3/2012 | Leenders et al. |
| 8,259,283 B2 | 9/2012 | Direcks et al. |
| 8,547,523 B2 | 10/2013 | Riepen et al. |
| 2004/0136494 A1 | 7/2004 | Lof et al. |
| 2004/0160582 A1 | 8/2004 | Lof et al. |
| 2004/0207824 A1 | 10/2004 | Lof et al. |
| 2004/0211920 A1 | 10/2004 | Derksen et al. |
| 2005/0007569 A1 | 1/2005 | Streefkerk et al. |
| 2005/0024609 A1 | 2/2005 | De Smit et al. |
| 2005/0264778 A1 | 12/2005 | Lof et al. |
| 2006/0103830 A1 | 5/2006 | Holmes et al. |
| 2006/0119817 A1 | 6/2006 | Maria Hennus et al. |
| 2006/0232756 A1 | 10/2006 | Lof et al. |
| 2007/0268466 A1 | 11/2007 | Leenders et al. |
| 2008/0165331 A1 | 7/2008 | Jacobs et al. |
| 2008/0186460 A1 | 8/2008 | Auer-Jongepier et al. |
| 2008/0309891 A1 | 12/2008 | Chang et al. |
| 2009/0206304 A1 | 8/2009 | Dziomkina |
| 2009/0237632 A1 | 9/2009 | Direcks et al. |
| 2010/0313974 A1 | 12/2010 | Riepen et al. |
| 2011/0013169 A1 | 1/2011 | Lafarre et al. |
| 2011/0228238 A1 | 9/2011 | Roset et al. |
| 2011/0228248 A1 | 9/2011 | Lafarre et al. |
| 2011/0261332 A1 | 10/2011 | Cortie et al. |
| 2011/0285976 A1 | 11/2011 | Roset et al. |

FOREIGN PATENT DOCUMENTS

| | | |
|---|---|---|
| CN | 1637608 | 7/2005 |
| EP | 1 420 300 | 5/2004 |
| JP | 2002-036373 | 2/2002 |
| JP | 2003-324028 | 11/2003 |
| JP | 2004-289127 | 10/2004 |
| JP | 2007-142168 | 6/2007 |
| JP | 2007-158343 | 6/2007 |
| JP | 2007-201384 | 8/2007 |
| JP | 2007-525007 | 8/2007 |
| JP | 2008-103703 | 5/2008 |
| JP | 2008-153651 | 7/2008 |
| JP | 2009-188119 | 8/2009 |
| JP | 2009-231838 | 10/2009 |
| JP | 2011-134776 | 7/2011 |
| JP | 2011-192994 | 9/2011 |
| WO | 99/49504 | 9/1999 |
| WO | 2005/064405 | 7/2005 |

OTHER PUBLICATIONS

U.S. Office Action dated Oct. 9, 2013 in corresponding U.S. Appl. No. 13/047,251.

U.S. Office Action dated Oct. 29, 2013 in corresponding U.S. Appl. No. 13/109,036.

U.S. Office Action dated Jun. 4, 2014 in corresponding U.S. Appl. No. 13/047,251.

U.S. Office Action dated Dec. 4, 2014 in corresponding U.S. Appl. No. 13/047,251.

U.S. Office Action dated Jun. 16, 2015 in corresponding U.S. Appl. No. 13/047,251.

Office Action dated Aug. 31, 2020 issued in corresponding U.S. Appl. No. 16/203,799 (17 pgs.).

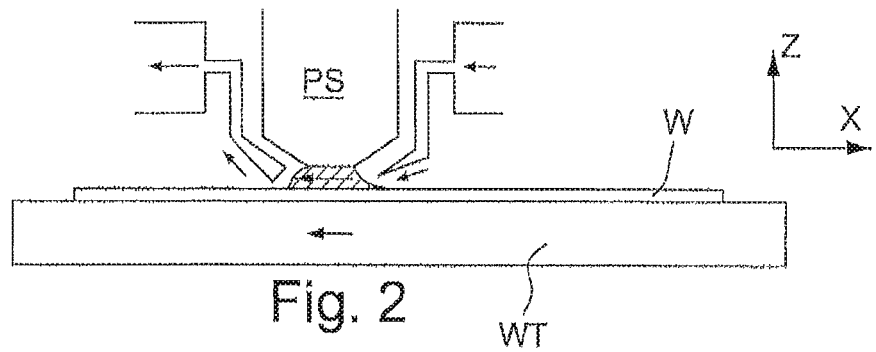
Fig. 2
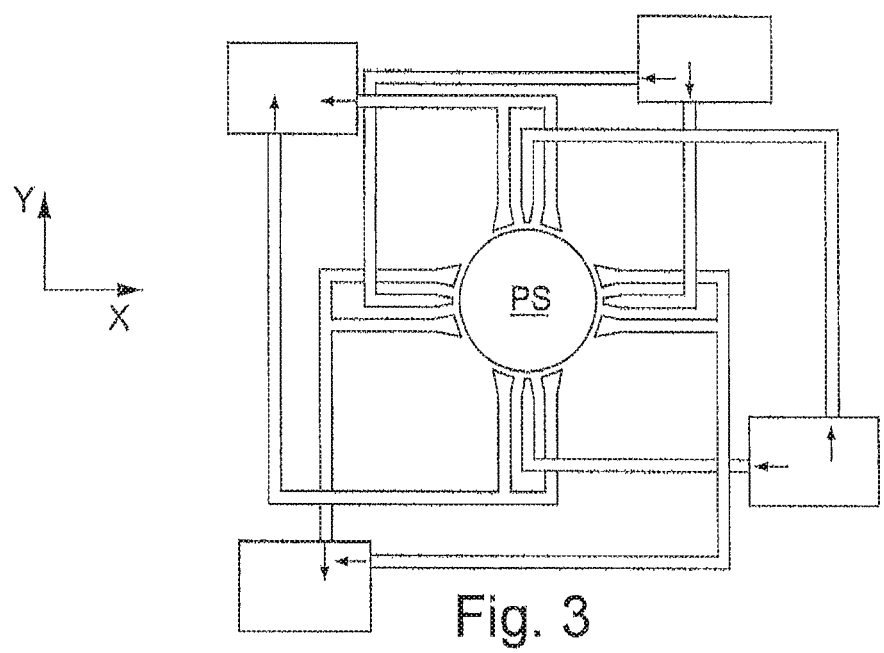
Fig. 3
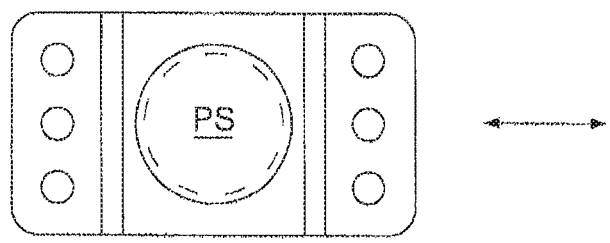
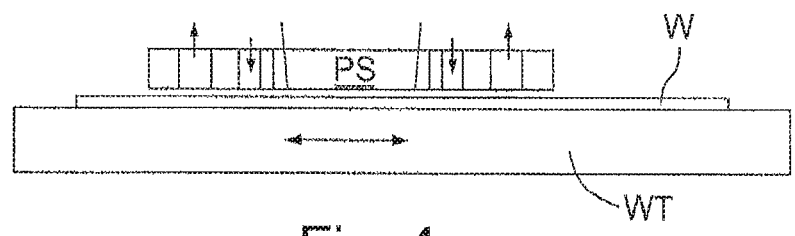
Fig. 4

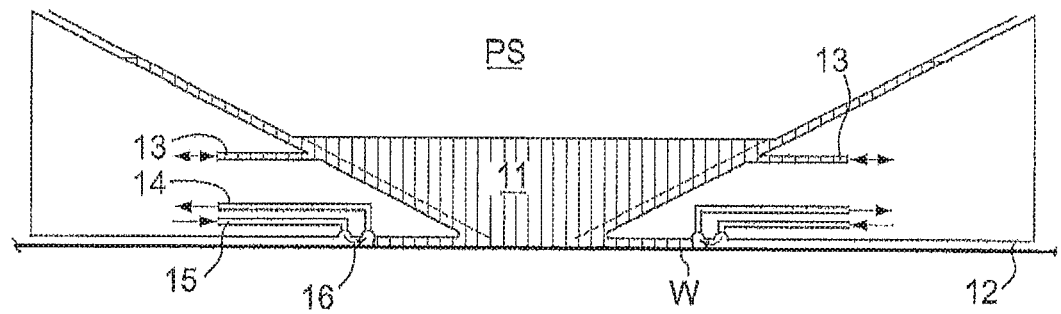
Fig. 5
Fig. 6
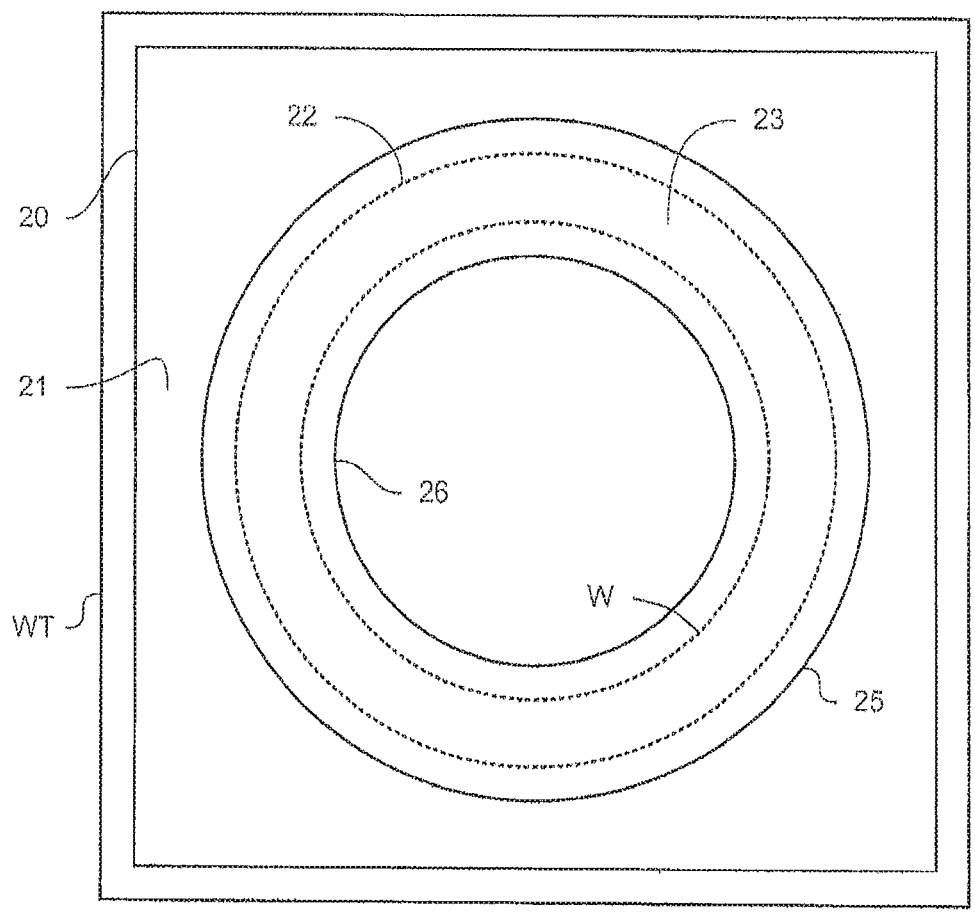

Fig. 21
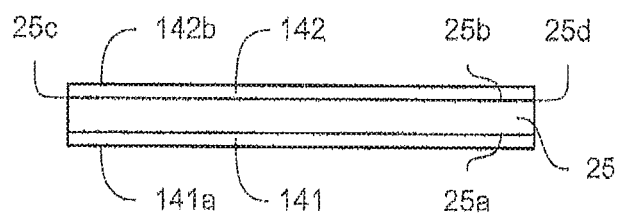
Fig. 22                    Fig. 23
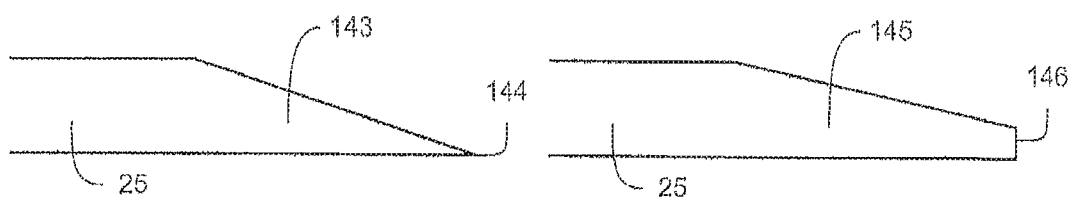
Fig. 24                    Fig. 25
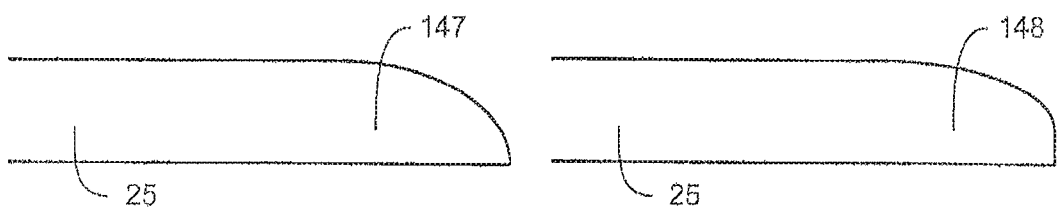

LITHOGRAPHIC APPARATUS, COVER FOR USE IN A LITHOGRAPHIC APPARATUS AND METHOD FOR DESIGNING A COVER FOR USE IN A LITHOGRAPHIC APPARATUS

This application is a continuation of U.S. patent application Ser. No. 14/973,421, filed Dec. 17, 2015, which is a continuation of U.S. patent application Ser. No. 13/047,165, filed Mar. 14, 2011, which claims priority and benefit under 35 U.S.C. § 119(e) to U.S. Provisional Patent Application No. 61/314,266, filed on Mar. 16, 2010, to U.S. Provisional Patent Application No. 61/346,213, filed on May 19, 2010, and to U.S. Provisional Patent Application No. 61/388,923, filed on Oct. 1, 2010. The content of each of the foregoing applications is incorporated herein in its entirety by reference.

FIELD

The present invention relates to a lithographic apparatus, cover for use in a lithographic apparatus and a method for designing a cover for use in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system and the substrate. In an embodiment, the liquid is distilled water, although another liquid can be used. An embodiment of the present invention will be described with reference to liquid. However, another liquid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

Other arrangements which have been proposed include a confined immersion system and an all wet immersion system. In a confined immersion system a liquid supply system provides liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504.

In an all wet immersion system, as disclosed in PCT patent application publication WO 2005/064405 the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. Liquid is allowed to leak over the remainder of the substrate. A barrier at the edge of a substrate table prevents the liquid from escaping so that it can be removed from the top surface of the substrate table in a controlled way.

The immersion system may be a fluid handling system or apparatus. In an immersion system, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. The fluid handling system may be located between the projection system and the substrate table. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In a fluid handling system or liquid confinement structure, liquid is confined to a space, for example within a confinement structure. The space may be defined by the body of the confinement structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan" lithographic apparatus, the substrate tables swap takes place under the projection system.

SUMMARY

In a lithographic apparatus, a substrate is supported on a substrate table by a substrate holder. The substrate holder may be located in a recess of the substrate table. The recess may be dimensioned so that when a substrate is supported by the substrate holder the top surface of the substrate is generally in the same plane as the surface of the substrate table surrounding the substrate. Around the substrate, there may be a gap between an edge of a substrate and an edge of the substrate table. Such a gap may be undesirable in an immersion system of a lithographic apparatus. As the gap moves under the immersion liquid in the space between the final element of the projection system and the underlying surface, the meniscus between the confinement structure and the underlying surface crosses the gap. Crossing the gap may increase the instability of the meniscus. The stability of the meniscus may decrease with increased relative speed, e.g. scanning or stepping speed, between the confinement structure and the substrate table. An increasingly unstable meniscus is a risk to increased defectivity. For example an unstable meniscus may enclose gas as a bubble in the immersion liquid, or may cause a droplet to escape from the immersion space. Such a bubble may be drawn into the space and result in imaging defects. A droplet may be a source of contaminants and a heat load as it evaporates and it may later collide with the meniscus causing a bubble to be drawn in to the space.

One or more problems of crossing the gap may be reduced by the provision of a two-phase extraction system. The two phase extraction system extracts fluid such as immersion liquid and gas (which may be present as a bubble in the liquid) from the gap. Sources of defectivity, such as releasing a bubble into the space or a droplet escaping from the space, may be reduced if not eliminated. However, the provision of such an extraction system may impart a heat load on the substrate table and the substrate. This may have a negative impact on the overlay accuracy of patterns formed on the substrate. The gap may implicitly limit the scan speed that may be used to achieve reliable imaging of a substrate.

It is therefore desirable to provide, for example, a system to increase the stability of the meniscus and reduce defectivity, for example the likelihood of creating a bubble or releasing a droplet.

In an aspect of an invention, there is provided a lithographic apparatus comprising:

a substrate table having an upper surface and a recess in the upper surface that is configured to receive and support a substrate;

a fluid handling structure configured to contain immersion fluid in a space adjacent to the upper surface of the substrate table and/or a substrate located in the recess;

a cover comprising a planar main body that, in use, extends around a substrate from the upper surface to a peripheral section of an upper major face of the substrate in order to cover a gap between an edge of the recess and an edge of the substrate; and an immersion fluid film disruptor, configured to disrupt the formation of a film of immersion fluid between an edge of the cover and immersion fluid contained by the fluid handling structure during movement of the substrate table relative to the fluid handling structure.

In an aspect of an invention, there is provided a method of designing a cover for use in an immersion lithographic apparatus that includes a substrate table having a substantially planar upper surface in which is formed a recess that is configured to receive and support a substrate, the cover comprising a substantially planar main body that, in use, extends around the substrate from the upper surface to a peripheral section of an upper major face of the substrate in order to cover a gap between an edge of the recess and an edge of the substrate; wherein an edge of the cover is tapered such that the thickness of the cover gradually decreases across the edge, the method comprising selecting the angle of the surface of the section of the cover that is tapered, relative to the upper major face of the substrate, in order that the section of the cover in use disrupts the formation of a film of immersion fluid between the edge of the cover and immersion fluid contained by a fluid handling structure of the lithographic apparatus during movement of the substrate table relative to the fluid handling structure.

In an aspect of an invention, there is provided a method of manufacturing a cover using the above method of designing a cover and a cover manufactured thereby.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a fluid handling structure as a liquid supply system for use in a lithographic projection apparatus;

FIG. 4 depicts a further liquid supply system for use in a lithographic projection apparatus;

FIG. 5 depicts, in cross-section, a liquid confinement structure which may be used in an embodiment of the present invention as a liquid supply system;

FIG. 6 depicts, in plan view, a substrate receiving section according to an aspect of the invention;

FIG. 21 depicts, in cross-section, an arrangement of a cover according to an aspect of the invention;

FIGS. 22 to 25 schematically depict possible configurations of the edge of a cover according to an aspect of the invention;

DETAILED DESCRIPTION

Figure 1:
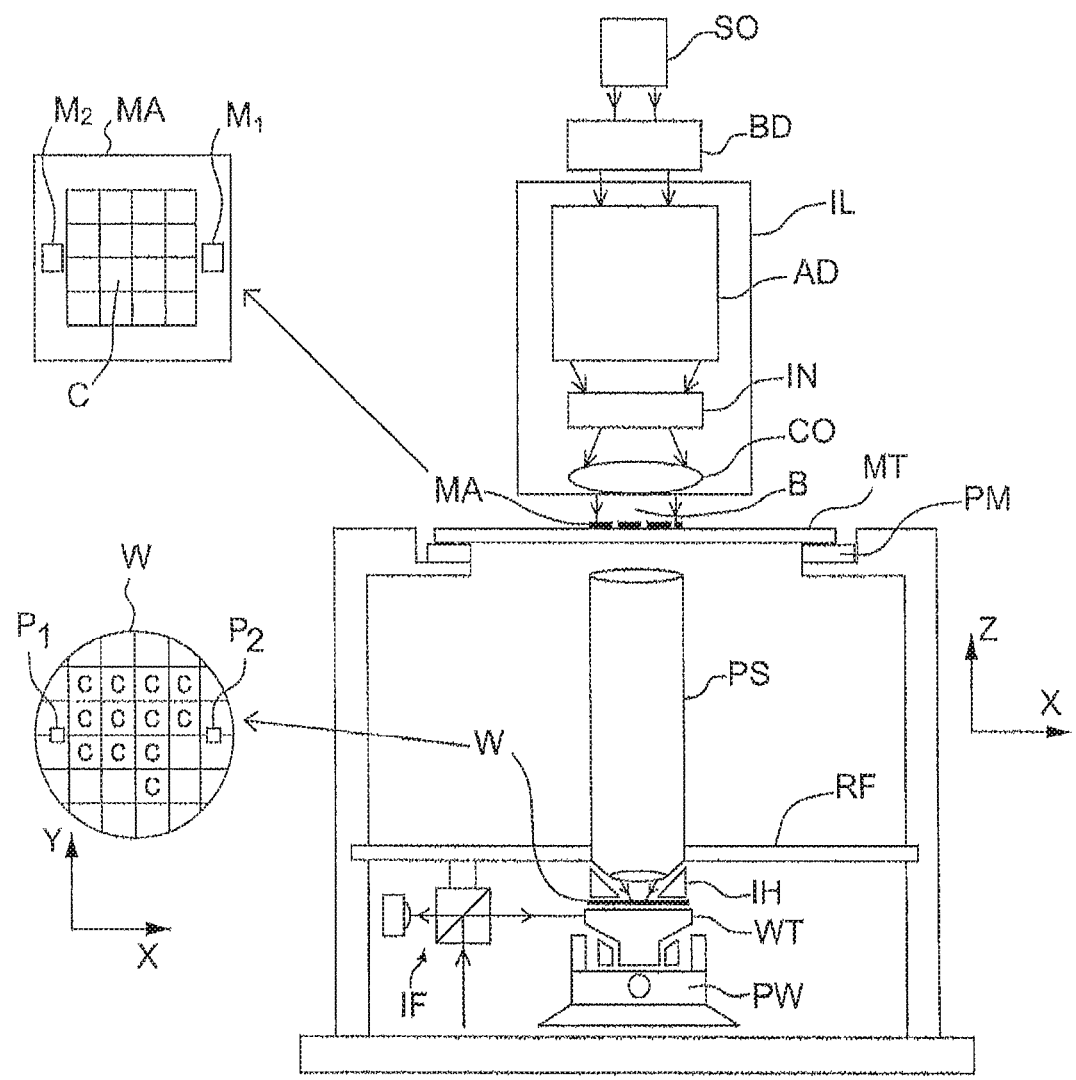
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5.

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, hereby incorporated in its entirety by reference.

FIG. 5 schematically depicts a localized liquid supply system with a liquid confinement structure 12. The liquid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as fluid seal, desirably a gas seal.

The liquid confinement structure 12 at least partly contains liquid in the immersion space 11 between a final element of the projection system PS and the substrate W. A contactless seal 16 to the substrate W may be formed around the image field of the projection system PS so that liquid is confined within the space 11 between the substrate W surface and the final element of the projection system PS. The immersion space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the liquid confinement structure 12 and the surface of the substrate W. Other types of seal are possible, as is no seal (for example in an all wet embodiment) or a seal achieved by capillary forces between the undersurface of the liquid confinement structure 12 and a facing surface, such as the surface of a substrate W, a substrate table WT or a combination of both.

The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Other arrangements are possible and, as will be clear from the description below, an embodiment of the present invention may use any type of localized immersion system.

In a localized immersion system a seal is formed between a part of the liquid confinement structure and an underlying surface, such as a surface of a substrate W and/or substrate table WT. The seal may be defined by a meniscus of liquid between the liquid confinement structure and the underlying surface. Relative movement between the underlying surface and the liquid confinement structure may lead to breakdown of the seal, for example the meniscus, above a critical speed. Above the critical speed, the seal may break down allowing liquid, e.g. in the form of a droplet, to escape from the liquid confinement structure, or gas, i.e. in the form of a bubble, to be enclosed in the immersion liquid within the immersion space.

A droplet may be a source of defectivity. The droplet may apply a thermal load on the surface which it is located as it evaporates. The droplet may be a source of contamination, in leaving a drying stain after it has evaporated. If the droplet lies in the path on the underlying surface which moves under the projection system, the droplet may contact the meniscus. The resulting collision between the meniscus and the droplet may cause a bubble to form in the liquid. A bubble may be a source of defectivity. A bubble in the immersion liquid may be drawn in to the space between the projection system and the substrate where it may interfere with an imaging projection beam.

Critical speed may be determined by the properties of the underlying surface. The critical speed of a gap relative to the confinement structure may be less than the critical speed for the surface of a relatively planar surface such as a substrate. On increasing the scan velocity above the lowest critical speed for a part of the undersurface, the scan velocity will exceed the critical speed for more of the underlying surface. The problem may be more significant at high scan velocities. However, an increased scan velocity is desirable because throughput increases.

FIG. 6 depicts, in plan view, a substrate table WT that may be used to support a substrate W. The substrate table may have a substantially planar upper surface 21. In the upper surface 21 is a recess 22 that is configured to receive and support a substrate W.

In the recess may be a substrate support which may be a surface of the recess. The surface of the recess 22 may include a plurality of protrusions on which a lower surface of the substrate is supported. The surface of the recess may include a barrier. In the surface of the recess may be formed a plurality of openings. The barrier surrounds the protrusions to define a space beneath the lower surface of the substrate W. The openings are connected to an under-pressure source. When a substrate is located above the openings a space is formed beneath the substrate W. The space may be evacuated by operation of the underpressure. This arrangement may be used in order to secure the substrate W to the substrate table WT.

In an arrangement, the recess may be configured such that the major faces of the substrate, namely the upper face and the lower face, are substantially parallel to the upper surface 21 of the substrate table. In an arrangement, the upper face of the substrate W may be arranged to be substantially coplanar with upper surface 21 of the substrate table.

It should be appreciated that in the present application, terms such as upper and lower may be used in order to define the relative positions of components within the systems described. However, these terms are used for convenience in order to describe the relative positions of the components when the apparatus is used at a particular orientation. They are not intended to specify the orientation in which the apparatus may be used.

As depicted in FIG. 6, a gap 23 may be present between an edge of the substrate W and an edge of the recess 22. According to an aspect of the invention, a cover 25 is provided that extends around the substrate W. The cover 25 extends from a peripheral section of the upper surface of the substrate W (which in an embodiment may be an edge of the substrate) to the upper surface 21 of the substrate table WT. The cover 25 may entirely cover the gap 23 between the edge of the substrate W and the edge of the recess 22. In addition, an open central section 26 of the cover 25 may be defined by an inner edge of the cover. The open central section 26 may be arranged such that, in use, the cover 25 does not cover portions of the substrate W on which it is intended to project a patterned beam of radiation. The inner edge of the cover may cover portions of the substrate which neighbor the surface of the substrate which is imaged by the patterned projection beam. The cover is located away from those portions of the substrate which are exposed by the patterned projection beam.

As shown in FIG. 6, when the cover 25 is placed on the substrate W, the size of the open central section 26 may be slightly smaller than the size of the upper surface of the substrate W. As shown in FIG. 6, if the substrate W is circular in shape, the cover 25 may be generally annular in shape when viewed in plan view.

The cover 25 may be in the form of a thin cover plate. The cover plate may, for example, be formed from stainless steel. Other material may be used. The cover plate may be coated with Lipocer coating of the type offered by Plasma Electronic GmbH. Lipocer is a coating which may be lyophobic (e.g. hydrophobic) and is relatively resistant to damage from exposure to radiation and immersion liquid (which may be highly corrosive). More information on Lipocer may be found in U.S. Patent Application Publication No US 2009/0206304, which is hereby incorporated by reference in its entirety.

As schematically depicted in FIG. 21, a lyophobic coating 141, such as a layer of Lipocer, may be applied to the lower surface 25a of the cover 25, namely the surface, that in use, may extend from a peripheral section of the upper surface of the substrate W to the upper surface 21 of the substrate table WT. The provision of such a coating 141 on the lower surface 25a may minimize or reduce the leakage of immersion liquid below the cover 25. For example, the coating 141 may reduce the leakage of immersion liquid between the cover 25 and the upper surface of the substrate W. Minimizing or reducing such immersion liquid leakage may in turn reduce the likelihood of immersion liquid being passed to the underside of the substrate W. This may reduce defects that may be introduced as a result of the so-called back side contamination. Minimizing or reducing immersion liquid leakage may reduce a thermal load on the substrate W.

The coating 141 on the lower surface 25a of the cover 25 may be selected to be an anti-sticking layer. In other words, the coating 141 may be selected to prevent, minimize or reduce adhesion of the cover 25 to the upper surface of the substrate W and/or the upper surface 21 of the substrate table WT. This may prevent or reduce damage to the cover 25, the substrate W and/or the substrate table WT when the cover 25 is removed from the substrate W and the substrate table WT.

The use of a coating 141 on the lower surface 25a of the cover 25 that is lyophobic and/or anti-sticking may prevent or reduce the accumulation of contamination particles on the lower surface of the cover 25. Such contaminant particles could result in damage to any of the cover 25, the substrate W and/or the substrate table WT or provide a source of subsequent defects on the substrate W. Alternatively or additionally, such contaminant particles may prevent a sufficient seal being formed between the cover 25 and the upper surface of the substrate W and/or the upper surface 21 of the substrate table WT, resulting in leakage of the immersion liquid, which may be undesirable. Accordingly, it may be desirable to prevent the accumulation of such contaminant particles.

The lower surface 25a of the cover 25 and/or the lower surface 141a of a coating 141 applied to the lower surface 25a of the cover 25 may be configured to have low surface roughness. For example, for a spray coating, the surface roughness $R_A$ may be less than 1 µm. For a deposited coating the surface roughness $R_A$ may be less than 200 nm. In general, reducing the surface roughness of the lower surface 25a of the cover and/or the lower surface 141a of a coating 141 applied to the lower surface 25a of the cover 25 may reduce stress concentrations on the surface of the substrate W. The surface roughness $R_A$ of parts of the cover 25 in contact with the substrate in use may desirably be less than 200 nm, desirably less than 50 nm, or desirably less than 10 nm.

Ensuring that the surface roughness of the lower surface 25a of the cover 25 and/or the lower surface 141a of a coating 141 applied to the lower surface 25a of the cover 25 is low may also assist in reducing or minimizing leakage of immersion liquid below the cover 25. The cover 25 may be arranged such that the flatness of the lower surface 25a of the cover 25 and/or the lower surface 141a of a coating 141 applied to the lower surface 25a of the cover 25 is maximized. This may provide optimized contact between the cover 25 and the substrate W and/or the substrate table WT, reducing or minimizing immersion liquid leakage.

As schematically depicted in FIG. 21, a coating 142 may alternatively or additionally be provided on the upper surface 25b of the cover 25. The upper surface 25b of the cover 25 or the upper surface 142b of a coating 142 on the upper surface 25b of the cover may be selected for smoothness. This may reduce the likelihood of the meniscus being pinned. For example, the upper surface 25b of the cover 25 or the upper surface 142b of a coating 142 on the upper surface 25b of the cover may be smooth such that the peak to valley distance of the surface is less than 10 µm, desirably less than 5 µm.

The coating 142 on the upper surface 25b of the cover 25 may be selected to be resistant to damage from exposure to radiation and immersion liquid. This may help ensure that the working life of the cover is sufficiently long to prevent unnecessary costs associated with replacing the cover 25, including downtime for the lithographic apparatus. The coating 142 on the upper surface 25b of the cover 25 may be selected to be lyophobic, as discussed above. Such a coating may provide a higher receding contact angle for the immersion liquid. This in turn may permit a higher scan speed to be used without, for example, the loss of immersion liquid from the meniscus, as discussed above. As noted above, the coating 142 on the upper surface 25b of the cover 25 may be formed from Lipocer.

It should be appreciated that the coatings 141, 142 on the lower and upper surface 25a, 25b of the cover 25 may be formed from the single layer of material. Alternatively, one or both of the coatings 141, 142 may be formed from a plurality of layers. For example, the layers may be formed from different materials, providing different benefits to the coating 141, 142. It should also be appreciated that the coatings 141, 142 on the lower and upper surfaces 25a, 25b of the cover 25 may be the same or different from each other.

The cover plate may, for example, be 25 µm thick. It may be etched to be locally reduced in thickness, for example at one or more of the edges. In a locally reduced area it may be 10 µm thick. The thickness of part of the cover may be reduced by other processes such as laser ablation, milling and polishing.

As depicted in FIG. 21, the edges 25c, 25d of the cover 25, namely the edges separating the lower and upper surfaces 25a, 25b of the cover 25 may be substantially perpendicular to the lower and upper surfaces 25a, 25b of the cover 25. Such an arrangement may be relatively simple to manufacture.

However, in an arrangement as depicted in FIG. 21, the edges 25c, 25d of the cover 25 may form a step on the surface of the substrate W and the upper surface 21 of the substrate table WT. Such a step may be undesirable. In particular, as discussed above, when the substrate W and substrate table WT move relative to the liquid confinement structure, care must be taken to ensure that the seal formed by a meniscus of liquid between the liquid confinement structure and the substrate W and/or substrate table WT does not break down. The introduction of a step on the surface may reduce the critical speed between the liquid confinement structure and the substrate W and/or substrate table WT up to which the liquid confinement structure and/or the substrate W/substrate table WT may move without the seal, for example the meniscus, breaking down.

One or more of the edges 25c, 25d of the cover 25 may be configured to provide a reduced step. For example, as discussed above, the thickness of the cover may be locally reduced at one or more of the edges. For example, one or more of the edges 25c, 25d of the cover 25 may be configured to have a profile as schematically depicted in any one of FIGS. 22 to 25.

As depicted in FIG. 22, an edge of the cover 25 may be configured to have a section 143 in which the cover 25 tapers to a point. Accordingly, such a cover may have no step. However, the extreme edge of the cover 25 may be susceptible to damage.

In an alternative arrangement, as depicted in FIG. 23, the cover 25 may have an edge section 145 that includes a step 146 that is smaller than the thickness of the cover 25 and a tapered section between the step 146 and the main body of the cover 25 that has the full thickness. For example, the main body of the cover 25 may be 25 µm thick and the step 146 may be 10 µm thick. Such an arrangement has a smaller step than a cover that has a perpendicular edge 25c, 25d but may be less susceptible to edge damage than an arrangement as depicted in FIG. 22.

As depicted in FIGS. 22 and 23, the tapered section 143, 145 of the edge of a cover 25 may be configured to linearly increase in thickness relative to the distance from the edge. However, this is not essential. As depicted in FIGS. 24 and 25, which correspond to FIGS. 22 and 23, respectively, the tapered sections 147, 148 may be curved instead. This may avoid the provision of sharp corners, for example between the tapered section and the remainder of the cover 25 or between the tapered section and a reduced step at the edge of the cover 25. Such sharp corners may be a source of instability in the seal, for example the meniscus, between the liquid confinement structure and the underlying surface. Accordingly, avoiding such sharp corners may reduce the likelihood of droplets being lost from the meniscus, reducing possible defectivity as discussed above.

As shown in FIGS. 22 to 25, the lower corner of the cover 25, namely the corner that in use may be in contact with the upper surface of the substrate W and/or the substrate table WT, may be a relatively sharp corner. This may provide a relatively good seal between the cover 25 and the substrate W and/or substrate table WT. However, it should be appreciated that the lower corner may be curved instead. This may reduce the likelihood of damage to the substrate W.

In general avoiding sharp corners on the cover may facilitate the provision of a coating on the cover 25, if desired.

It should be appreciated that, although FIGS. 22 to 25 depict one edge of a cover 25 with a tapered section and/or a rounded, one or more the edges of the cover 25 may be tapered and/or have one or more rounded corners as discussed above. Furthermore, the edges of a cover 25 may have a different respective arrangements of a tapered section and/or rounded corners.

A further issue that may affect the selection of the arrangement of one or both of the edges 25c, 25d of the cover 25 is the behavior of the immersion liquid when the liquid confinement structure 12 crosses the cover 25. This behavior may also be affected by the configuration of the liquid confinement structure 12 and one or more materials used for the substrate table WT and the cover 25.

For example, when using a liquid confinement structure that does not include a gas knife and a lyophilic (e.g., hydrophilic) substrate table WT and cover 25, liquid film pulling may be present. Liquid film pulling may also occur in other arrangements. Liquid film pulling may lead to liquid loss on the substrate, which is undesirable. In particular, such lost droplets may subsequently collide with the meniscus during further relative movement between the liquid confinement structure 12 and the substrate table WT. These collisions may result in the formation of bubbles in the immersion liquid.

Figure 33:
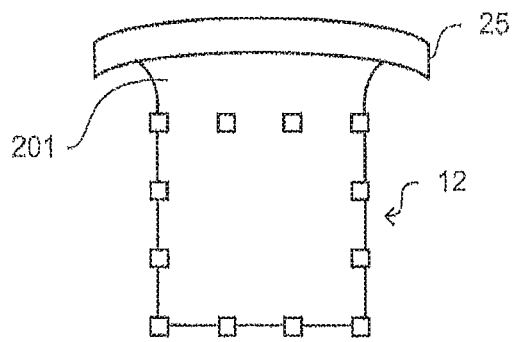
FIG. 33 depicts an arrangement of a cover in use.

The liquid film pulling may be caused by the movement of the edge of the cover 25 under the meniscus (or vice versa). When a meniscus crosses over a 90° height step, the meniscus velocity would have to be infinite during the step. Such a step occurs at a perpendicular edge 25c, 25d of a cover 25 such as shown in FIG. 21. Infinite meniscus velocity is not actually possible so the meniscus is stretched, resulting in liquid film pulling as depicted in FIG. 33. Subsequently, the liquid film 201 will break up, resulting in liquid loss on the substrate W and/or substrate table WT.

The liquid film pulling may be reduced by use of a tapered edge, for example as depicted in FIG. 22. However, although the liquid film is depinned earlier than in the case of a perpendicular edge, a liquid film may still be pulled. Accordingly, although liquid loss on the substrate and/or substrate table may be reduced, it may remain above a desired level. This may be because it is not possible to form an infinitely sharp tip at the edge of the cover 25. Therefore, there may remain a small edge that is effectively perpendicular at the end of the tip of the edge of the cover 25.

In an embodiment, an immersion liquid film disruptor is provided to stimulate fast break up of the liquid film. This may reduce the liquid loss.

In an embodiment, the immersion liquid film disruptor includes the provision of a tapered edge on the cover 25 that is specifically selected in order to reduce or minimize liquid film pulling.

Figure 37:
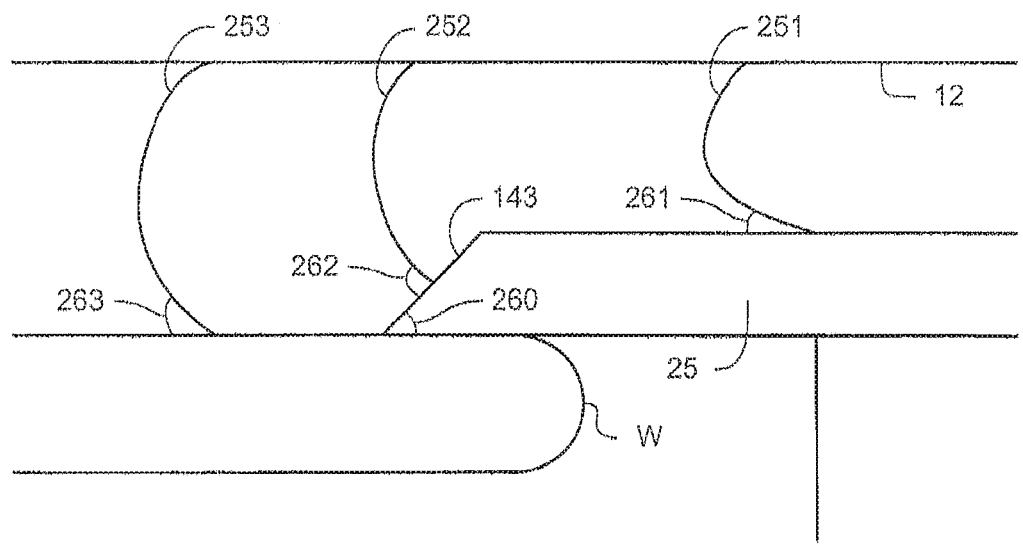
FIG. 37 illustratively depicts the position of a meniscus crossing the edge of a cover.

FIG. 37 schematically depicts the shape of a meniscus of the immersion liquid crossing the cover 25 (e.g., when the cover 25 moves relative to and under the meniscus). The meniscus profile 251, 252, 253 is depicted at three successive times. The first meniscus profile 251 is depicted at a point in time when the meniscus is in contact with a non-tapered portion of the cover 25. A second meniscus profile 252 is shown at the point in time at which the meniscus is in contact with a tapered section 143 of the edge of the cover 25. A third meniscus profile 253 depicts the meniscus at a third time point when it is in contact with the upper surface of the substrate W (in this case) and/or substrate table WT.

For each meniscus profile 251, 252, 253, FIG. 37 also depicts a respective dynamic contact angle 261, 262, 263, namely the angle of the meniscus profile 251, 252, 253 relative to a surface at the point at which it contacts the surface at a given velocity.

It will be appreciated that the dynamic contact angles 261, 263 of the meniscus in contact with the upper surface of the cover 25 in a non-tapered section and the upper surface of the substrate W/substrate table WT will be determined by the velocity of the substrate table WT (and therefore the cover 25 and the substrate W) relative to the liquid confinement structure 12 and the properties of the surface of the cover 25, the substrate W/substrate table WT, and the liquid.

As the meniscus traverses the tapered section 143 of the edge of the cover 25, the effective speed of the meniscus over the surface increases. This effective speed is dependent on the angle 260 of the surface of the tapered section 143 of the edge of the cover 25 relative to the upper surface of the substrate W. The greater the angle 260, the greater the effective velocity until, as discussed above, if the angle is 90°, the meniscus velocity would in theory be infinite (although in practice this does not happen and the meniscus stretches, resulting in liquid film pulling).

Figure 38:
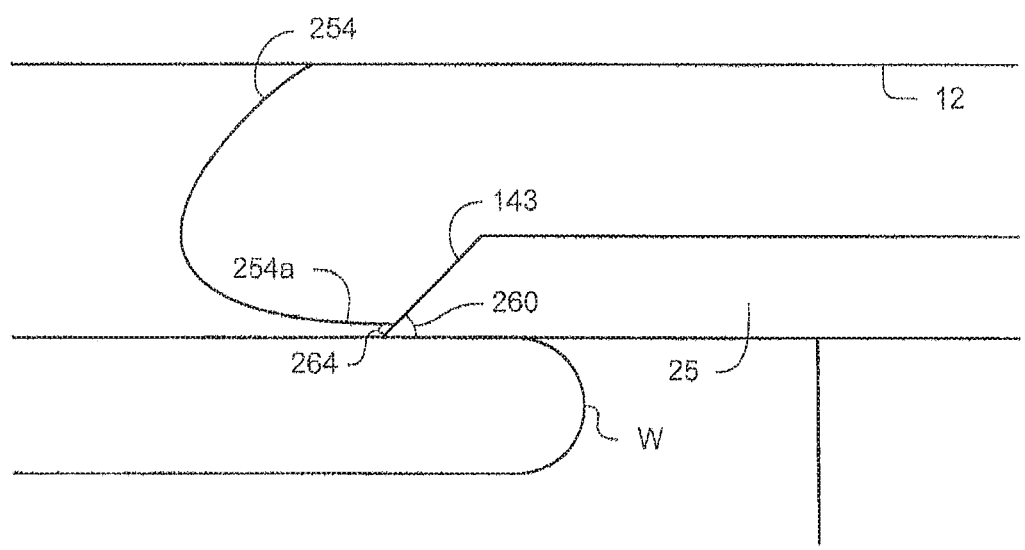
FIG. 38 illustratively depicts the position of a meniscus crossing a cover under a specific set of conditions.

FIG. 38 depicts a meniscus profile 254 in a specific situation in which the speed of the substrate table WT (and therefore the substrate W and the cover 25) relative to the liquid confinement structure 12 is such that the dynamic contact angle 264 of the meniscus relative to the surface of the tapered section 143 of the edge of the cover 25 is the same as the angle 260 of the surface of the tapered section 143 relative to the upper surface of the substrate W. Consequently, as shown, the section 254a of the meniscus profile 254 adjacent the edge of the cover 25 is approximately parallel to the upper surface of the substrate W. In such a situation, when the meniscus approaches the extreme edge of the tapered section 143 of the edge of the cover 25, an elongate section 254a of the meniscus profile 254 may approach the upper surface of the substrate W simultaneously, resulting in the formation of a film of liquid. This liquid film may subsequently break up, resulting in liquid loss on the substrate W and/or substrate table WT (where the tapered section is on the substrate table WT side).

It will be appreciated that the situation depicted in FIG. 38 may occur as a result of the combination of the speed of the substrate table WT relative to the liquid confinement structure 12, the nature of the material on the upper surface of the cover 25 (for example whether or not it is lyophobic) and the angle 260 of the tapered section 143 of the edge of the cover 25.

In an embodiment, the angle 260 of the tapered section 143 of the edge of the cover 25 may be selected in order to help ensure that, in use, the dynamic contact angle 262 of the meniscus as it crosses the tapered section 143 of the edge of the cover 25 remains larger than the angle 260 of the upper surface of the tapered section 143 of the edge of the cover 25 relative to the upper surface of the substrate W.

This angle may be determined by performing appropriate experiments in order to identify the impact on the dynamic contact angle 262 of variations of the angle 260 of the upper surface of the tapered section 143 of the edge of the cover 25 for different velocities of the substrate table WT relative to the liquid confinement structure 12. Experiments may also be performed in order to determine the effect of variations in the extent to which the upper surface of the cover 25 is lyophobic for the immersion liquid to be used, namely for variations of the static contact angle. Such variations may be taken into account when selecting the angle 260 of the tapered section 143 of the edge of the cover 25 to be used.

The appropriate angle 260 of the upper surface of the tapered section 143 of the edge of the cover 25 may be specifically selected for a combination of a desired velocity of the substrate table WT, to be used in operation of the lithographic apparatus when the meniscus crosses the cover 25, and a particular surface material of the cover 25. For example the surface material of the cover may be a material selected to form a coating 142 on the upper surface of the cover 25, as discussed above.

In particular, this may reduce the likelihood of pinning of the meniscus at the edge of the cover 25. In turn, this may reduce the likelihood of formation of a liquid film, which may break up and result in liquid loss on the substrate W/substrate table WT, as discussed above.

In an embodiment of the present invention, it may be desirable to ensure that, in use, the dynamic contact angle 262 of the meniscus profile 252 at the point when the meniscus traverses the tapered section 143 of the edge of the cover 25 is such that this dynamic contact angle 262, less the angle 260 of the upper surface of the tapered section 143 of the edge of the cover 25, is greater than the dynamic contact angle 263 of the meniscus profile 253 when the meniscus is in contact with the upper surface of the substrate W/substrate table WT. In other words the difference between the dynamic contact angle 262 and the angle 260 of the upper surface of the tapered section 143 is greater than the dynamic contact angle 263 of the meniscus profile 253 when the meniscus is in contact with the upper surface of the substrate W/substrate table WT. This may reduce the likelihood of pinning of the meniscus at the edge of the cover 25. In turn, this may reduce the likelihood of formation of a liquid film, which may break up and result in liquid loss on the substrate W/substrate table WT, as discussed above.

In an embodiment, an appropriate angle 260 of the upper surface of the tapered section 143 of the edge of the cover 25 may be selected taking into account the dynamic contact angle 263 of the meniscus profile 253 when the meniscus is in contact with the upper surface of the substrate W/substrate table WT. It will be appreciated that this in turn may be dependent on the intended speed of the substrate table WT in use when the meniscus is crossing the substrate W/substrate table WT at a location adjacent to the edge of the cover 25.

Where, for example, the velocity of the substrate table WT relative to the liquid confinement structure 12 is approximately 0.5 m/s, the static contact angle of the upper surface of the cover 25 is approximately 90° and the static contact angle of the upper surface of the substrate is approximately 70° or 80°, an angle 260 of the upper surface of the tapered section 143 of the edge of the cover 25 relative to the upper surface of the substrate W may be in the range of from about 15° to 45°, from about 15° to 30°, or approximately 20°.

As above, the desired angle 260 of the upper surface of the tapered section 143 of the edge of the cover 25 may depend on the nature of the surface of the cover 25, in particular in the region of the tapered section 143. In general, it is desirable that the upper surface be lyophobic because this may increase the angle 260 of the upper surface of the tapered section 143 of the edge of the cover 25 that may be permitted for a given acceptable level of liquid loss on the substrate W/substrate table WT. This is beneficial because reducing the angle 260 below certain levels may make manufacture of the cover 25 difficult. Furthermore, reducing the angle 260 may result in a larger section of the edge of the cover 25 being sufficiently thin that it is easily damaged.

However, formation of a cover 25 having a lyophobic upper surface may have additional problems. In particular, as discussed above, a lyophobic coating 142 may be applied to the upper surface of the cover 25. However, such a coating may degrade in use such that the static contact angle of the immersion liquid on the upper surface decreases over time.

In an embodiment, the selection of the angle 260 of the upper surface of the tapered section 143 of the edge of the cover 25 may be selected to take into account the expected degradation of the upper surface of the cover 25 over an acceptable time period. Beyond this point, the static contact angle of the immersion liquid on the upper surface of the cover 25 may decrease to such an extent that the angle 260 of the edge of the cover is not sufficiently small to prevent or sufficiently reduce pinning of the meniscus at the edge of the cover 25. Consequently, at this point, liquid loss on the substrate W/substrate table WT may exceed an acceptable limit. At this stage, it may be necessary to replace the cover 25.

In an embodiment, the immersion liquid film disruptor includes one or more structures that may be applied onto the upper surface and/or edge of the cover 25. This structure causes film instability, resulting in film break up. Such a surface profile may be combined with a cover 25 having a perpendicular edge or any arrangement of tapered edge, as described above.

The structure applied to the upper surface and/or edge of the cover 25 may be in the form of any kind of plural local variations of the surface. For example, elongate features such as ridges and/or channels may be provided. The cross section of such ridges and/or channels may be any appropriate shape. Alternatively or additionally, relatively short features such as pimples and/or dimples may be provided. Such pimples and/or dimples may have any appropriate shape.

Figure 34:
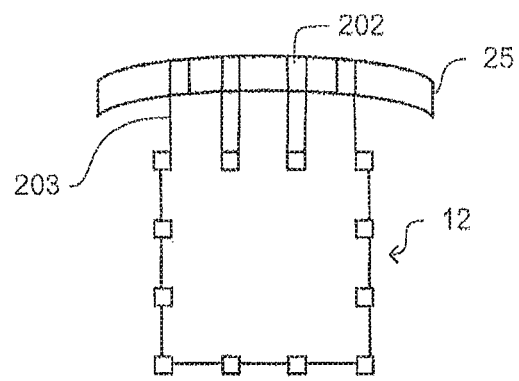
FIG. 34 depicts an arrangement of a cover in a system including an immersion fluid film disruptor according to an aspect of the invention.

FIG. 34 depicts an embodiment, in which a plurality of ridges 202 are provided on the upper surface of the cover 25. As shown, such an arrangement promotes the break up of the liquid film 203. Such an arrangement may reduce the likelihood of the meniscus being pinned.

Figure 35:
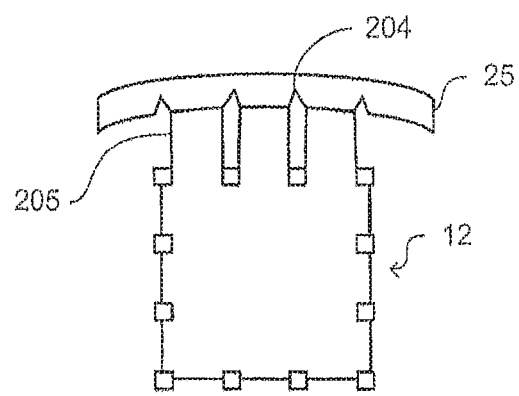
FIG. 35 depicts an arrangement of a cover in a system including an immersion fluid film disruptor according to an aspect of the invention.

FIG. 35 depicts an embodiment, in which a plurality of channels 204 are provided on the edge of the cover 25. As shown, such an arrangement promotes the break up of the liquid film 205. Such an arrangement may reduce the likelihood of the meniscus being pinned.

Figure 36:
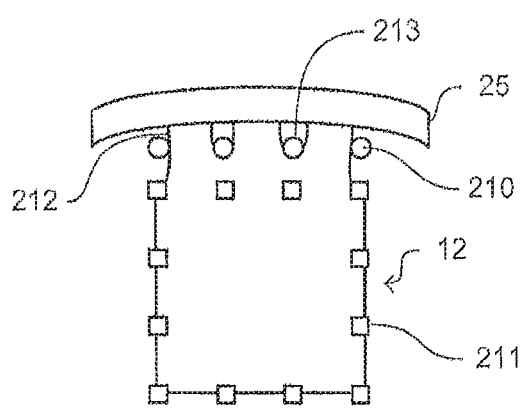
FIG. 36 depicts an arrangement of a cover in a system including an immersion fluid film disruptor according to an aspect of the invention.

In an embodiment, depicted in FIG. 36, the immersion liquid film disruptor includes a plurality of discrete gas jets 210 provided by the liquid confinement structure 12. The gas jets 210 are directed onto the liquid film as it starts to form, promoting fast break up of the film 212. Such an arrangement may reduce the likelihood of the meniscus being pinned.

The gas jets 210 may be provided, for example, by a row of apertures formed in the surface of the liquid confinement structure 12 and connected to a gas supply. The apertures may be provided outward of a line of openings 211 that are formed in the surface of the liquid confinement structure and used to extract immersion liquid in order to contain the immersion liquid. In other words, the apertures providing the gas jets 210 may be on the opposite side of a line of openings 211 to the space in which the immersion liquid is contained.

An advantage of using a plurality of discrete gas jets 210, rather than a gas knife for example, is that liquid droplets may not be collected between a line of gas jets 210 and a line of openings 211. Collection of liquid droplets in such an area may be a problem during movement of the substrate table WT relative to the liquid confinement structure. For example, liquid droplets collected in such an area during movement may combine to form large droplets.

Figure 39:
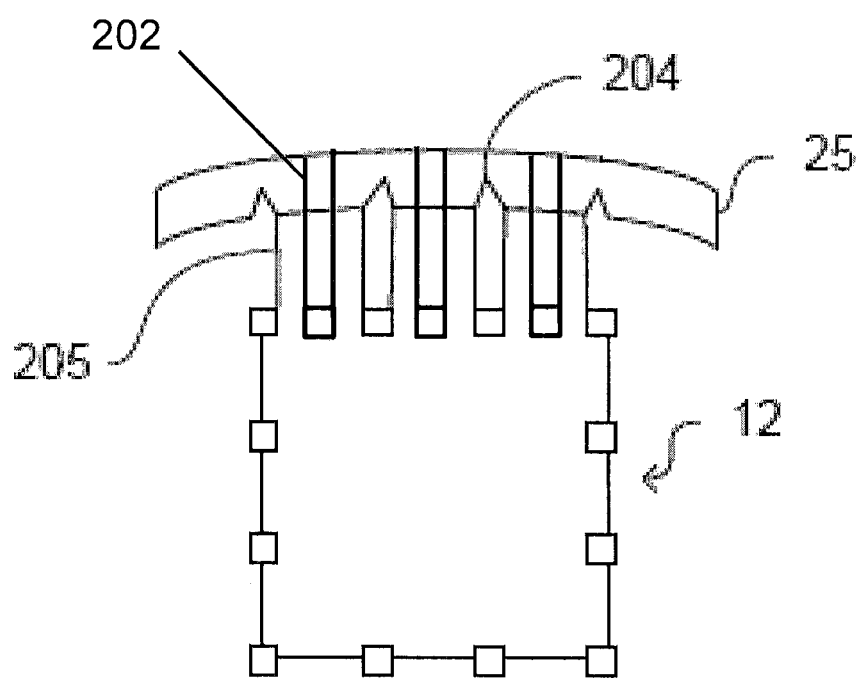
FIG. 39 depicts an arrangement of a cover in a system including an immersion fluid film disruptor according to an aspect of the invention.

It will be appreciated that, in an embodiment, the immersion liquid film disruptor may include any combination of the above described arrangements, an example of which is shown in FIG. 39.

In an embodiment, the upper surface 25b of the cover 25 or the upper surface 142b of a coating 142 on the upper surface 25b of the cover 25 may be configured to be as flat as possible. This may further reduce any instabilities of the meniscus discussed above, reducing the likelihood of droplets being lost from the meniscus and subsequent defects as discussed above.

In an embodiment, the cover may be a part of the substrate table. An actuator system may be provided to move the cover between at least closed and open positions. In the closed position, the cover 25 may be in contact with the upper surface of a substrate W within the recess 22. In the closed position, the cover 25 may be in contact with the upper surface 21 of the substrate table WT. In the closed position, the cover 25 may cover the gap 23 between the edge of the substrate W and the edge of the recess 22.

The cover 25 may be configured so that, as the gap passes underneath the immersion space 11, with respect to the immersion liquid in the space, the gap is closed. By closing the gap, the stability of the meniscus in crossing the gap may be improved. In an embodiment, the cover forms a seal with one or both of the upper surface of a substrate W within the recess 22 and the upper surface 21 of the substrate table WT. A cover 25 that provides a seal with both the upper surface of the substrate W and the upper surface 21 of the substrate table WT may prevent immersion liquid from passing into the gap 23. The cover may reduce the inflow of immersion liquid into the gap 23. The cover may help reduce, if not prevent, the flow of bubbles into the space 11 as a consequence of the gap passing underneath the space 11.

In the open position, the cover 25 may be moved away from its location at the closed position relative to the surface of the recess 22. When a substrate is supported by the surface of the recess 22, the cover 25 may be set apart from the substrate W. The open position may be arranged such that, when the cover 25 is in the open position, the substrate W may be unloaded from the substrate table WT. If a substrate W is not present in the recess 22, a substrate W may be loaded onto the substrate table WT.

Figure 8:
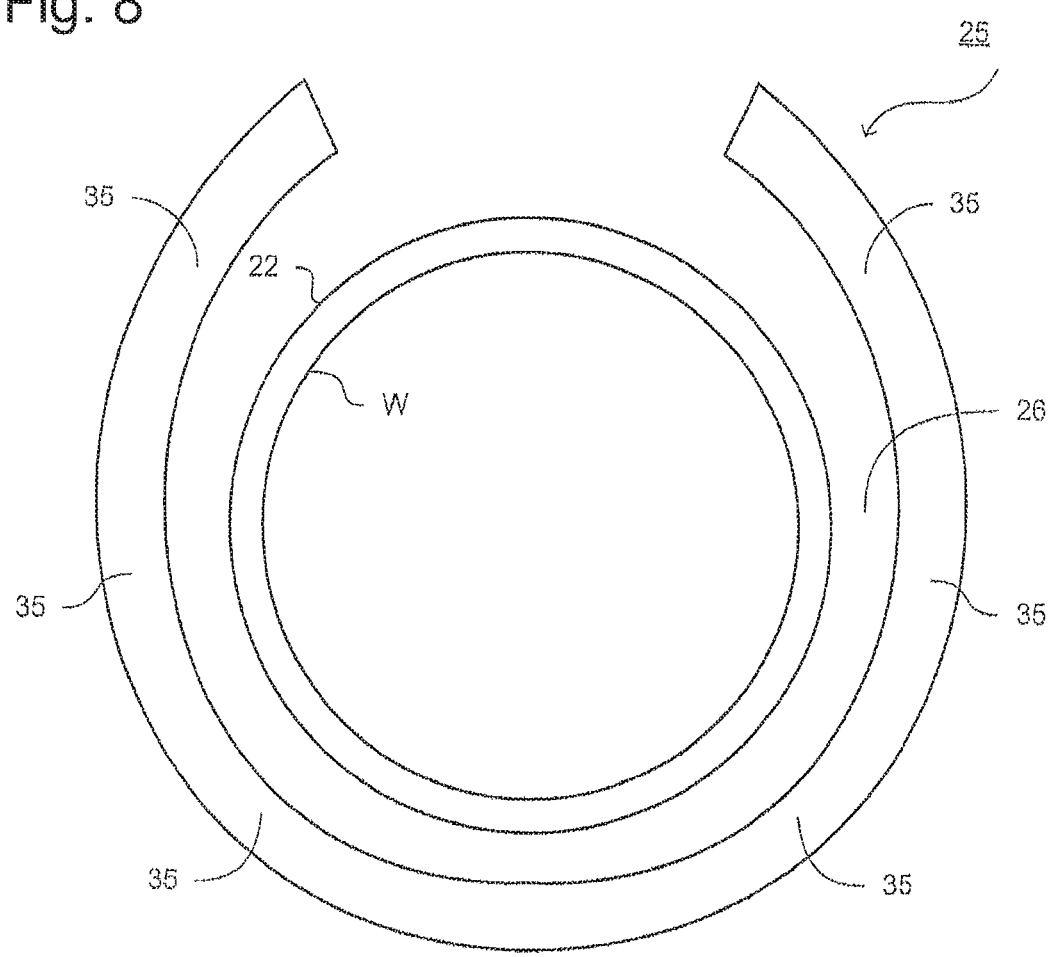

In an embodiment, the actuator system may be configured such that, in moving the cover 25 from the closed position to the open position, it enlarges the open central section 26 of the cover 25, as depicted in FIG. 8. In such a process, the open central section 26 of the cover 25 may be enlarged sufficiently that the open central section 26 is larger than the upper surface of the substrate W in the open position. The open central section 26 of the cover 25 may be enlarged sufficiently for the substrate W to be able to pass through the central open section 26 of the cover 25.

In an embodiment, a substrate W may be loaded onto, or unloaded from, a substrate table by moving the cover 25 to the open position and passing the substrate W through the central open portion 26 of the cover 25. In the case of loading a substrate W to a substrate table WT, once the substrate W has passed through the open central section 26 of the cover 25, the substrate W may be received in the recess 22 of the substrate table WT. Subsequently, the cover 25 may be moved by the actuator system to the closed position, in which it covers the gap 23 between the edge of the substrate W and the edge of the recess 22 in which the substrate W is supported.

The actuator system may be configured such that, in moving the cover 25 to the open position, a plurality of portions of the cover 25 are moved in different respective directions relative to each other. This arrangement may be used in order to enlarge the open central section 26 of the cover 25 in moving to the open position.

In an embodiment, the actuator system may be configured to elastically deform at least a part of the cover 25. For example, the actuator system may elastically deform at least part of the cover 25 when the actuator moves the plurality of portions of the cover 25 in respective different directions in order to enlarge the open central section 26.

Figure 7:
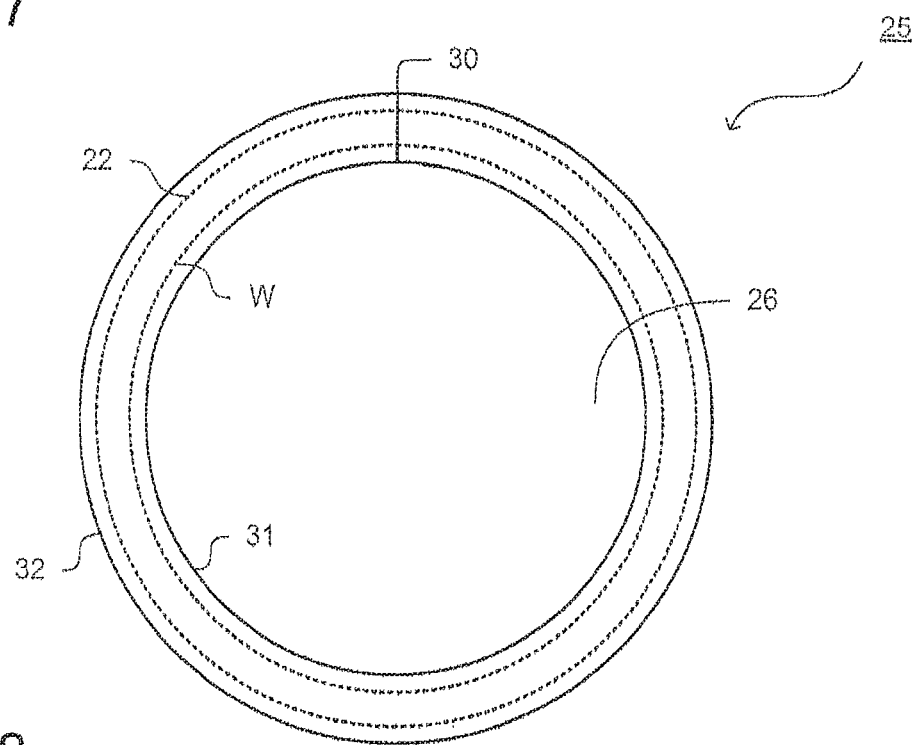
FIGS. 7 and 8 depict, in plan view, a cover according to an aspect of the invention in open and closed positions, respectively.

FIGS. 7 and 8 depict, in plan view, a cover 25 according to an embodiment of the invention in the closed and open positions, respectively. As shown, the cover 25 may be generally annular in shape in plan view. The inner periphery 31, e.g. circumference, of the cover 25 may define the open central section 26 of the cover 25 when it is in the closed position. A break in the generally annular shape of the cover 25 may be provided between the inner periphery, e.g., circumference, 31 and the outer periphery, e.g., circumference, 32 of the cover 25.

In an arrangement such as that depicted in FIGS. 7 and 8, the cover 25 has a plurality of portions 35 each of which are moveable by the actuator system in respective different directions. In moving the plurality of portions 35 the open central section 26 of the cover 25 may be enlarged or reduced. The plurality of portions may be combined together to form a single integral cover. However, as depicted in FIG. 8, the provision of the break 30 across the periphery, e.g., circumference, of the cover 25 may facilitate the elastic deformation of the cover 25 in order to enlarge the central open section 26.

Although the arrangement of FIGS. 7 and 8 includes a break 30 from the inner periphery 31 to the outer periphery 32 of the cover 25, this is not essential.

Additional breaks may be provided in order to facilitate the enlargement, e.g., by elastic deformation, of the cover 25 in order to enlarge the open central section 26 of the cover 25 according to this aspect of the invention.

The provision of any of the covers disclosed herein may have a variety of additional benefits for a substrate table within a lithographic apparatus in addition to the reduction of defects caused by bubbles and/or the reduction of bubbles, as described above.

The cleaning of the substrate table WT and the immersion system may be reduced. This, in turn, may reduce the down time of the lithographic apparatus.

A cover may reduce the transfer of contaminants from the upper surface of the substrate W to the lower surface of the substrate W. This may reduce defects that may be introduced as a result of the so-called back side contamination.

The provision of a cover covering the gap between the edge of the substrate W and the edge of the recess 22 may enable the edge of the substrate W to traverse the projection system and immersion system at a higher speed than is otherwise possible. This may increase the throughput of the lithographic apparatus.

The provision of a cover may obviate the need for an extraction system in order to remove immersion liquid and bubbles from the gap between the edge of the substrate W and the edge of the recess 22. This may reduce the heat load applied to the substrate table WT. The thermal stability of the substrate table WT may improve. The overlay accuracy of patterns formed on the substrate W may consequently improve.

An extraction system for the gap between the edge of the substrate W and the edge of the recess 22 may be a two-phase extractor. This type of extractor may produce flow induced vibrations. Therefore, the provision of a cover, which may result in such an extractor being obsolete (not being required), may reduce the vibrations within the substrate table WT.

The provision of a cover may result in a simpler system overall than a system that uses an extractor for the gap between the edge of the substrate W and the edge of the recess 22, as disclosed above. The provision of a cover over the gap 23 may reduce the cost of goods of the apparatus as a whole.

It should be appreciated that the provision of a cover according to an aspect of the invention may eliminate the need for an extraction system at the gap between the edge of the substrate W and the edge of the recess 22, as discussed above. However, a cover according to an aspect of the present invention may be used in conjunction with an extraction system. The benefits discussed above may still apply because the requirements of the extraction system may be reduced.

Figure 9:
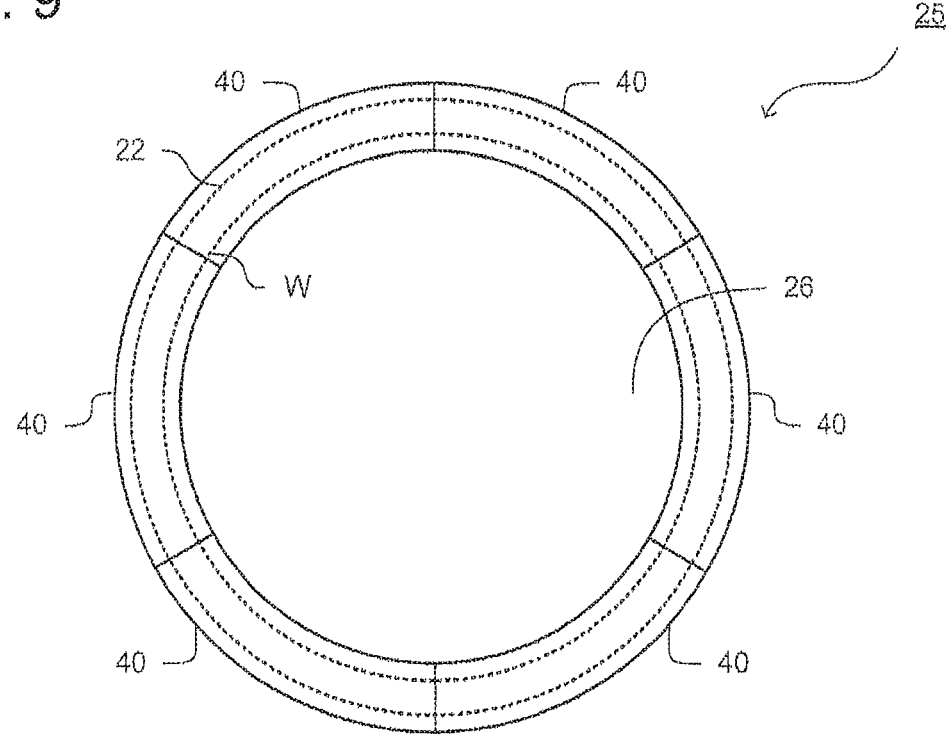
FIGS. 9 and 10 depict, in plan view, a cover according to an aspect of the invention in closed and open positions, respectively.
Figure 10:
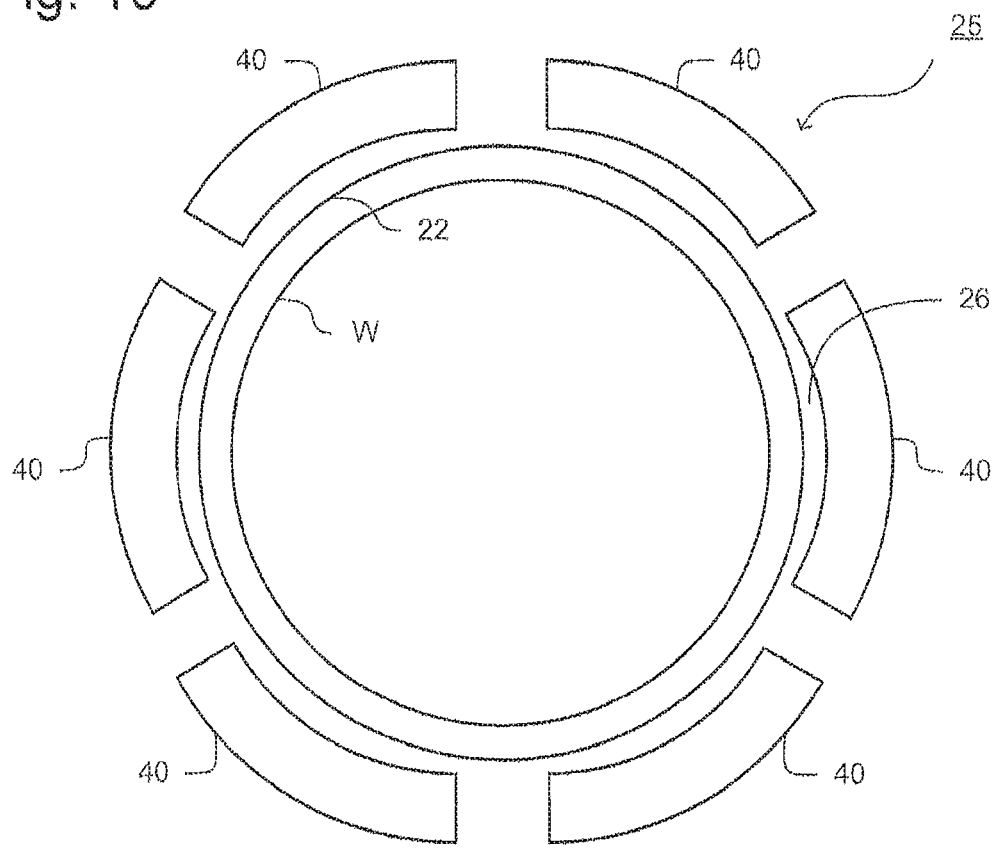

FIGS. 9 and 10 depict, in plan view, an arrangement of a cover 25 according to an embodiment of the invention. The cover depicted in FIGS. 9 and 10 is similar to the cover depicted in FIGS. 7 and 8 and, for brevity, only the differences will be discussed in detail.

As shown, the cover 25 is formed from a plurality of discrete sections 40. In the closed position, the sections 40 are arranged to abut adjacent sections 40 of the cover 25 in order to form a single cover 25. For example, as shown in FIG. 9, for a circular substrate W, when each of the discrete sections 40 of the cover 25 abut each other in the closed position, the combination of the discrete sections 40 provides a cover 25 having a generally annular shape.

The actuator system is configured such that it can move portions of the cover 25 in different directions in order to move the cover from the closed position to the open position. In the case of a cover 25 such as that depicted in FIGS. 9 and 10, each such portion of the cover 25 is one of the discrete sections 40. The actuator system moves each of the discrete sections 40 of the cover 25 in a respective different direction.

When the cover 25 is in the open position, the discrete sections 40 of the cover 25 may be set apart from each other, providing the enlarged open central section 26 through which the substrate W may pass as described above.

Figure 11:
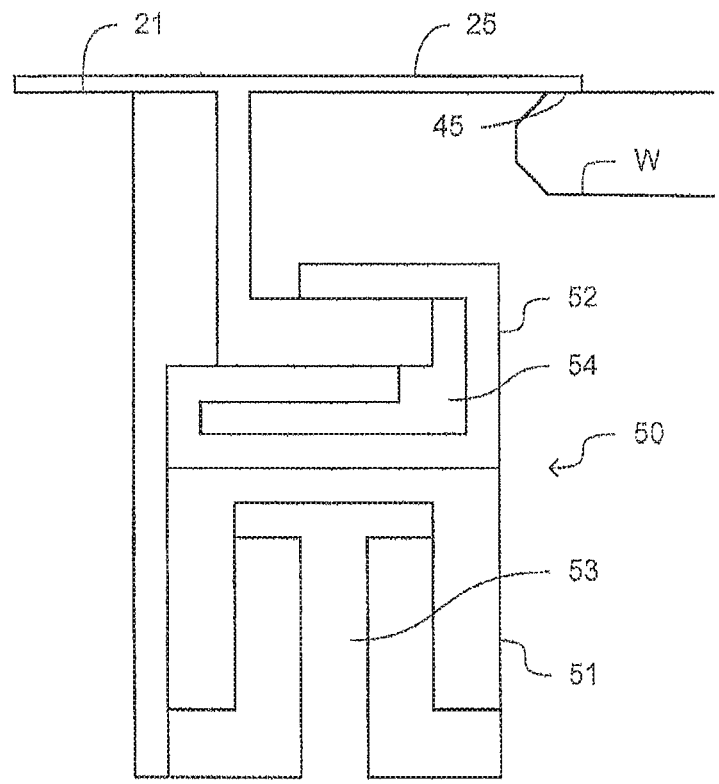
FIGS. 11, 12 and 13 depict, in cross-section, an actuator system for a cover according to an aspect of the invention in, respectively, the closed position, an intermediate position and the open position.
Figure 12:
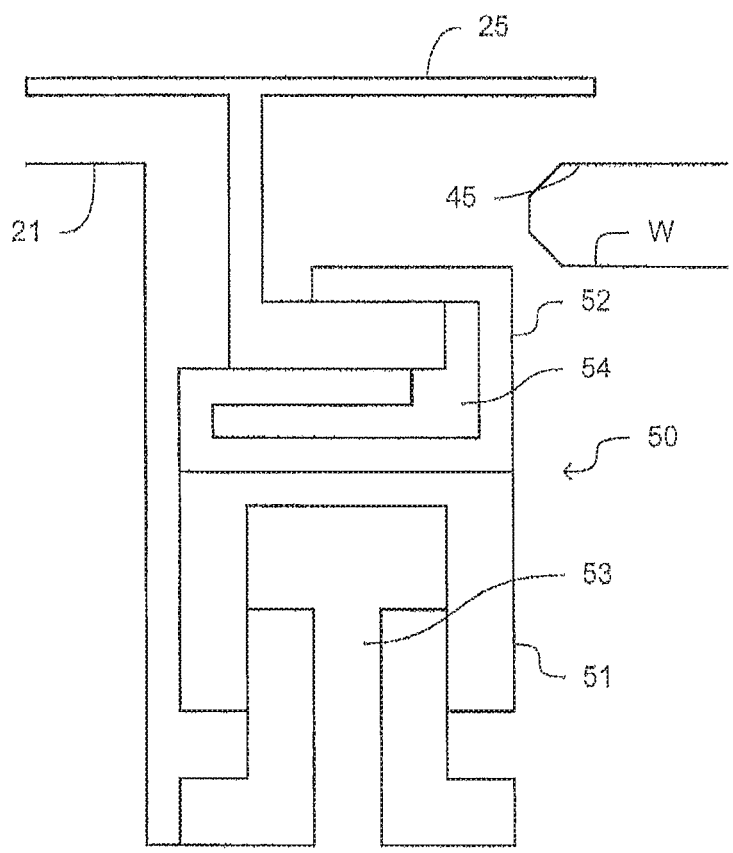
Figure 13:
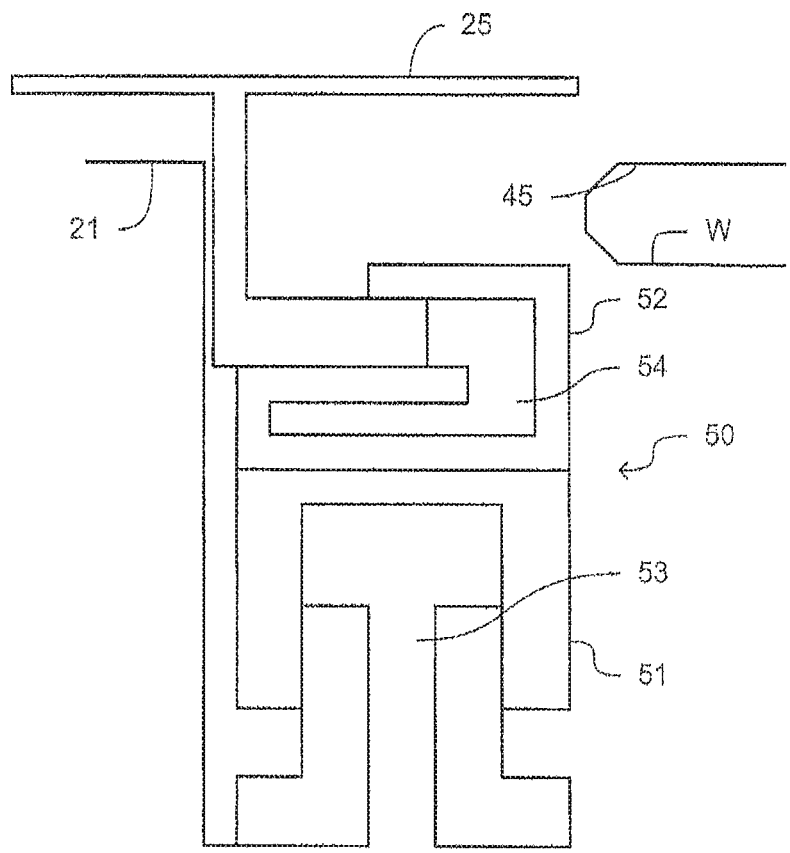

FIGS. 11, 12 and 13 depict, in cross-section, an actuator system that may be used in an aspect of the invention in, respectively, the closed position, an intermediate position and the open position.

As shown FIG. 11, in the closed position, each portion of the cover 25 is positioned on, and extends between, a peripheral portion 45 of the upper surface of the substrate W and the upper surface 21 of the substrate table WT. In moving the cover 25 from the closed position to the open position, the actuator system 50 may be configured such that each portion of the cover 25 is first moved in a direction substantially perpendicular to the upper surface of the substrate W and the upper surface 21 of the substrate table WT.

FIG. 12 depicts a portion of the cover 25 in an intermediate position between the closed and open positions after an initial movement, as described above.

In moving from the open position to the closed position, the cover 25 may be moved to the intermediate position shown in FIG. 12 such that the cover 25 may subsequently be moved to the closed position only by a movement in a direction substantially perpendicular to the upper surface of the substrate W and the upper surface 21 of the substrate table WT.

Such an arrangement may beneficially ensure that, when the cover 25 is in contact with the substrate W or close to the substrate W, the relative movement of the cover 25 to the substrate W is only in a direction that is substantially perpendicular to the upper surface of the substrate W. This may prevent or reduce the generation of contaminant particles at the edge of the substrate W. This may prevent or reduce the movement of pre-existing contaminant particles at the edge of the substrate W towards the upper surface of the substrate W on which a pattern is to be formed. On contacting the substrate by moving the cover in a direction substantially perpendicular to the surface of the substrate W, a force applied to the substrate W is applied in a direction substantially perpendicular to the substrate W. As the force is applied around the periphery of the substrate W, the force applied is substantially uniform. Distortions in the substrate W caused by the application of the force are thereby reduced, if not minimized. Forces in the plane of the substrate W by application of the cover 25 are reduced or minimized, limiting the movement of the substrate W in the recess. Position errors by applying the cover 25 to the edge of the substrate W may be reduced, if not prevented.

The actuator system 50 may be configured such that it can move each of the portions of the cover 25 between the intermediate position depicted in FIG. 12 and the open position depicted in FIG. 13 by moving each of the portions of the cover 25 in a direction that is substantially parallel to the upper surface of the substrate W and the upper surface 21 of the substrate table WT.

As shown in FIGS. 11, 12 and 13, the actuator system 50 may include an actuator stage 51 that is configured to provide movement of the cover 25 in a direction substantially perpendicular to the upper surface of the substrate W and the upper surface 21 of the substrate table WT, for example in a vertical direction. The actuator stage 51 may be referred to as a transverse actuator stage.

The actuator system 50 may include an actuator stage 52 configured to provide movement of the cover 25 in a direction substantially parallel to the upper surface of the substrate W and the upper surface 21 of the substrate table WT, for example in a horizontal direction. The actuator stage 52 may be referred to as a lateral actuator stage. position.

It will be appreciated that, although the use of pneumatic actuators as depicted may be beneficial, alternative actuators may be used for one or both of the actuator stages 51, 52. For example, an electrostatic actuator and/or an electromagnetic actuator may be used.

The actuator stage 51 may be configured in order to ensure that substantially the only movement provided is in the direction substantially perpendicular to the upper surface of the substrate W and the upper surface 21 of the substrate table WT. The actuator stage 51 may include one or more movement guides. The one or more movement guides are configured to permit relative movement of the components of the actuator stage 51 in the direction substantially perpendicular to the upper surface of the substrate W and the upper surface 21 of the substrate table WT. However, the movement guide reduces or minimizes the movement of the component of the actuator stage 51 in a direction substantially parallel to the upper surface of the substrate W and the upper surface 21 of the substrate table WT.

Figure 14:
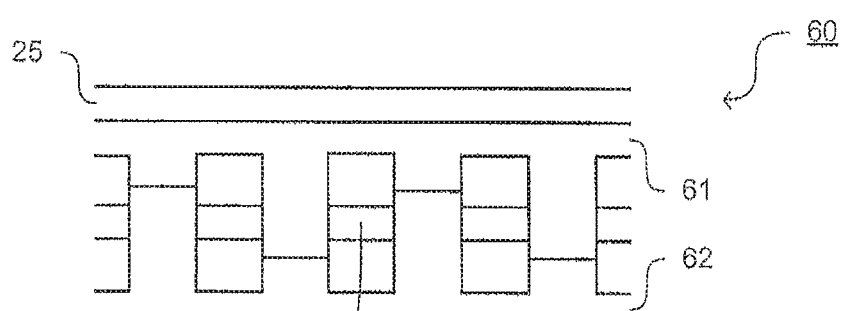
FIGS. 14 and 15 depict, in cross-section, an arrangement of movement guides that may be used in an actuator system of an aspect of the invention.
Figure 15:
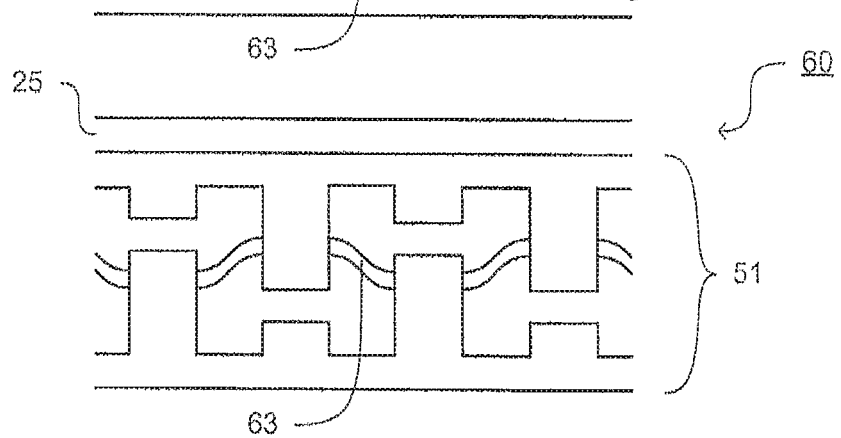

FIGS. 14 and 15 depict, in cross-section, an arrangement of movement guides that may be used in order to help ensure that the actuator stage 51 only provides movement in a particular direction. Such a direction may be a direction substantially perpendicular to the upper surface of the substrate W and the upper surface 21 of the substrate table WT. FIG. 14 depicts a movement guide 60 when the cover 25 is in the closed position. FIG. 15 depicts the movement guide 60 when the cover 25 is in the open position.

As shown, the actuator stage 51 includes first and second components 61,62. The first and second components 61,62 may be moved relative to one another in the direction substantially perpendicular to the upper surface of the substrate W and the upper surface 21 of the substrate table WT by means of the actuator provided as described above. Elastic hinges 63 are provided between the first and second components 61,62 of the actuator stage 51. The elastic hinges permit movement of the first and second components 61,62 in a direction substantially perpendicular to the upper surface of the substrate W and the upper surface 21 of the substrate table WT. The elastic hinges are configured to restrict movement in a direction substantially perpendicular to this desired direction of movement.

It will be appreciated that an alternative or additional movement guide may be used. However, the use of one or more such elastic hinges as described above may be beneficial because this form of movement guide does not have, or desirably minimizes, frictional forces. Frictional forces may reduce the reproducibility of the force that is applied on the upper surface of the substrate W when the cover 25 is moved to the closed position.

Figure 16:
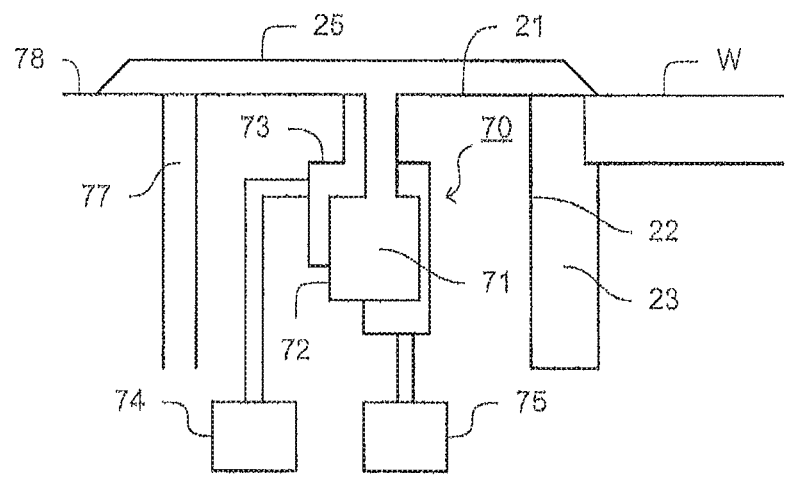
FIGS. 16, 17 and 18 depict an actuator system for a cover according to an aspect of the invention in, respectively, a closed position, an intermediate position and an open position.
Figure 17:
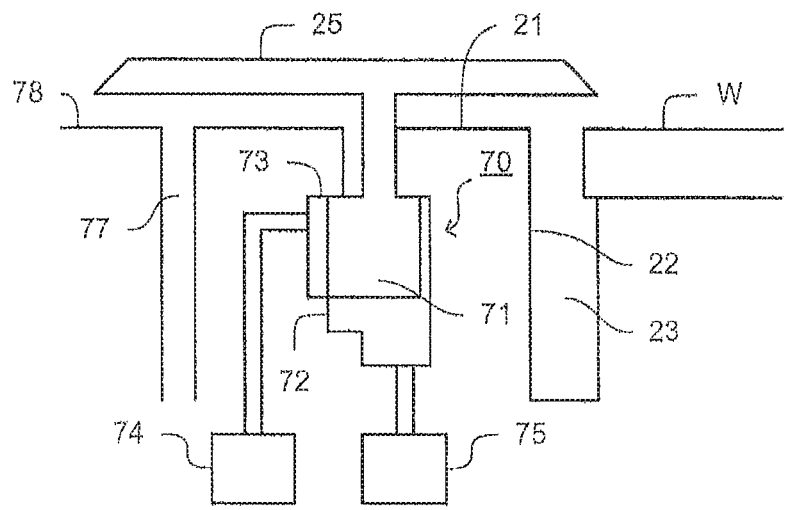
Figure 18:
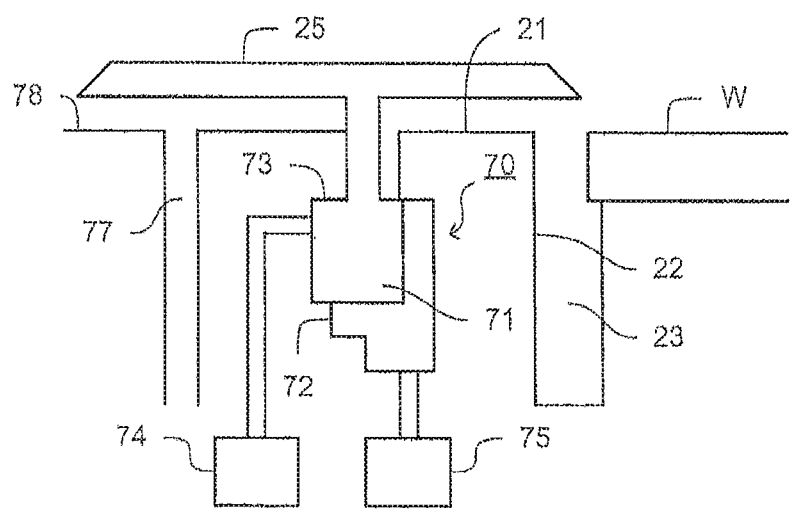

FIGS. 16, 17 and 18 depict a further actuator system that may be used with an aspect of the present invention. FIG. 16 depicts the actuator system 70 when the cover 25 is in the closed position. FIG. 17 depicts the actuator system 70 in an intermediate position. FIG. 18 depicts the actuator system 70 when the cover 25 is in the open position.

The actuator system 70 depicted in FIGS. 16, 17 and 18 may provide a simpler actuation system than that depicted in FIGS. 11, 12 and 13. Separate actuator stages are not required. Instead, each portion of the cover 25 is connected to a piston 71 that is mounted within a system of movement guides 72,73 within the substrate table WT.

A movement guide 72 may, in cooperation with the piston 71, be used to move the cover 25 from the closed position in a direction substantially perpendicular to the upper surface of the substrate W and the upper surface 21 of the substrate table WT to the intermediate position. A movement guide 73 may be arranged such that, in conjunction with the piston 71, it moves the cover 25 in a direction substantially parallel to the upper surface of the substrate W and the upper surface 21 of the substrate table WT. In order to move the cover 25 between the closed and open positions, the gas pressure on one or both sides of the piston 71 may be changed by connecting one or both of the movement guides 72,73 to an appropriate under-pressure or over-pressure source 74,75.

The cover 25 may be configured such that in the closed position it not only covers the gap 23 between the edge of the substrate W and the edge of the recess 22 in the substrate table but it covers a further gap 77. For example, an additional gap may exist between the actuator system and a part of the substrate table further away from the substrate holder such as an additional component 78. The additional component 78 may be a component of a sensor system used in order to monitor the position and/or displacement of the substrate table WT relative to the projection system.

Figure 19:
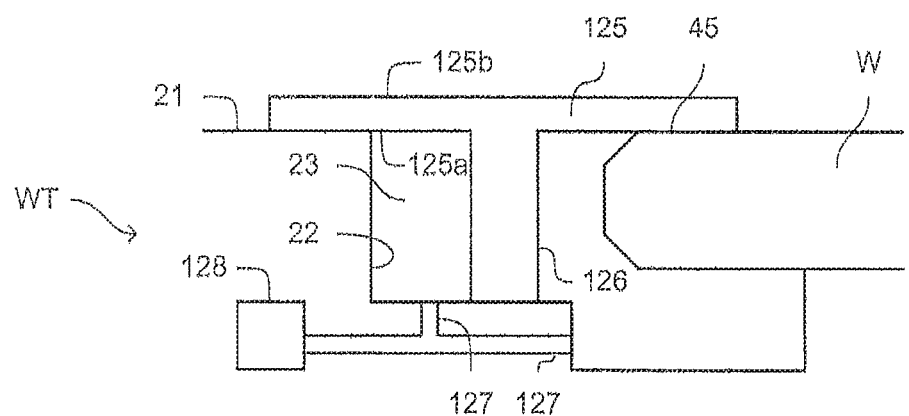
FIGS. 19 and 20 depict, in cross-section, a cover according to an aspect of the invention.
Figure 20:
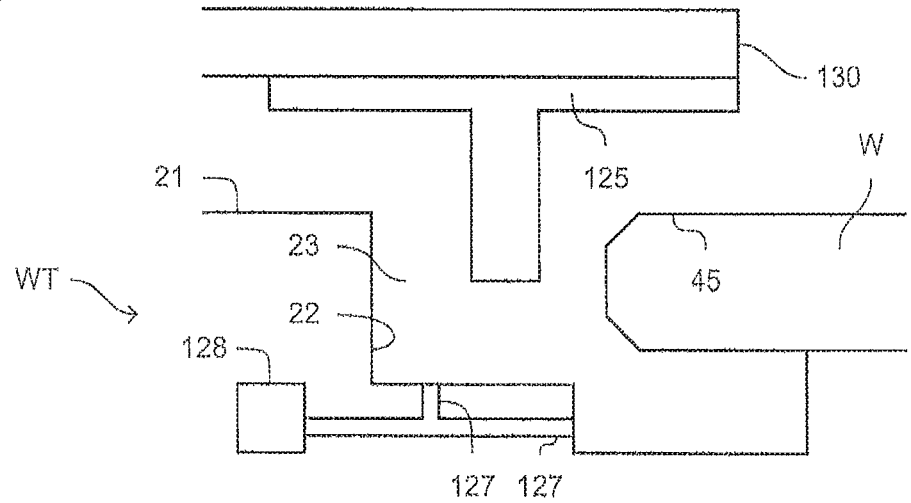

FIGS. 19 and 20 depict, in cross-section, an embodiment of the invention in which a different arrangement of cover 125 is provided to cover the gap 23 between the edge of the substrate W and the edge of the recess 22 in the substrate table WT in which the substrate W is supported. In particular, a cover 125 of an embodiment of the invention may be configured to be moved away from the substrate table WT to permit loading/unloading a substrate W to/from the recess 22 in the substrate table WT. In such an arrangement it is not necessary to enlarge an open central section of the cover 125 in moving the cover 125 to the open position.

In common with the arrangements discussed above, the cover 125 is arranged in the form of a thin plate of material that surrounds the edge of the substrate W. The cover 125 extends from a peripheral area 45 of the upper surface of the substrate W to the upper surface 21 of the substrate receiving section. Openings 127 for gas outlets may be provided that are connected to an under-pressure source 128. The pressure in a space on the lower side 125a of the cover 125 may be lower than the gas pressure on the upper side 125b of the cover 125. The pressure difference may be used in order to secure the cover 125 and substantially prevent any movement of the cover 125 during use.

In order to prevent or reduce deformation of the cover 125, the cover may include one or more supports 126 that extend from the lower surface 125a of the cover 125 to the bottom of the recess 22 when the cover 125 is located on top of a substrate W in the recess 22.

In order to move the cover 125 in order to permit loading and unloading of a substrate W, a cover handling system 130 such as a robot arm may be provided. The cover handling system 130 may be specifically configured such that the movement of the cover 125 when the cover 125 is in contact with the substrate W or close to the substrate W is only in a direction that is substantially perpendicular to the upper surface of the substrate W and the upper surface 21 of the substrate table WT.

As discussed above, in embodiments of the invention, for example those depicted in FIGS. 11 to 18, an actuator system may be provided that moves the cover 25 from an open position, in which a substrate W may be loaded to the substrate table WT and/or a substrate W may be unloaded from a substrate WT, to a closed position, in which the cover 25 extends from the upper surface 21 of the substrate table WT to the periphery of the substrate W. In the closed position, the cover 25 may be in physical contact with the peripheral section of the substrate W and the upper surface 21 of the substrate table WT, in particular if the cover 25 is to form a seal. Such physical contact could result in damage of one or more of the cover 25, the substrate W and/or the upper surface 21 of the substrate table WT. Accordingly, an appropriate control system for the actuator system may be provided.

In an embodiment of the invention, a controller is provided in order to control the actuator system that positions the cover 25. In order to help ensure that the cover is accurately moved relative to the substrate W and/or substrate table WT, the controller may use data that represents the height of the upper surface of at least the peripheral section of the substrate W relative to the upper surface 21 of the substrate table WVT (or vice versa). Such data may, for example, be previously acquired in a metrology station, which may be part of the lithographic apparatus or part of a lithography system including the lithographic apparatus.

Based on the data representing the height of the upper surface of the peripheral section of the substrate W relative to the upper surface 21 of the substrate table WT (or vice versa), the controller may determine the position to which the cover 25 should be moved in order to provide a desired contact between the cover 25 and the upper surface of the substrate W and the upper surface 21 of the substrate table WT.

An appropriate feedback mechanism may be provided for the controller to control the actuator system to move the cover 25 to the desired position determined by the controller.

The controller may be configured, for example, to help ensure that the position of the cover 25 in the closed position is sufficiently close to or in contact with the upper surface of the peripheral section of the substrate W to prevent, reduce or minimize leakage of the immersion liquid. Alternatively or additionally, the controller may be configured to help ensure that, when the cover 25 is in the closed position, the force exerted on the upper surface of the peripheral section of the substrate W by the lower surface of the cover 25 is within a given range. For example, it may be desirable to ensure that the force is less than a certain value in order to prevent or reduce the likelihood of damage to the substrate W. Alternatively or additionally, it may be desirable to ensure that the force exerted on the upper surface of the peripheral section of the substrate W by the lower surface of the cover 25 exceeds a certain value in order to ensure that sufficient contact is made in order to control the leakage of immersion liquid below the cover 25.

In an embodiment of the invention, the data representing the height of the upper surface of the peripheral section of the substrate W relative to the upper surface 21 of the substrate table WT (or vice versa) may provide data for the relative height at a plurality of locations around the peripheral section of the substrate W. From such data, the controller may be able to determine the desired position of respective portions of the cover 25 at a plurality of locations around the edge of the substrate W.

In an embodiment of the invention, the actuator system may be correspondingly configured to be able to adjust the height of the cover 25 independently at a plurality of locations around the cover 25. In such an arrangement, local variations of the height of the upper surface of the substrate W and/or substrate table WT may be taken into account in controlling the positioning of the cover 25 in the closed position. This may in turn assist in preventing or reducing immersion liquid leakage and/or damage to the substrate W, the substrate table WT and/or the cover 25.

As identified above, when the cover 25 is moved to the closed position, it may exert a force on the upper surface of the peripheral section of the substrate W. It should be appreciated that this force may be exerted regardless of the arrangement of the control system for the actuator system used to move the cover 25. The force exerted on the substrate W may be sufficient to cause a movement of the upper surface of the substrate W, for example due to deformation of the substrate and/or due to deformation of the support section of the substrate table WT that supports the substrate W. Such movement of the upper surface of the substrate W may be undesirable because it may result in errors in the pattern formed on the substrate W.

In an embodiment of the invention, the cover 25 may be provided with a region that is relatively flexible, namely has a lower stiffness than the remainder of the cover. Such a relatively flexible section may be configured such that, when the cover 25 is moved to the closed position, any forces exerted on the cover and/or any inaccuracies in the positioning of the cover relative to the substrate W and/or substrate table WT results in a deformation of the relatively flexible section of the cover rather than a deformation of the substrate W or the support section of the substrate table WT that supports the substrate.

Figure 26:
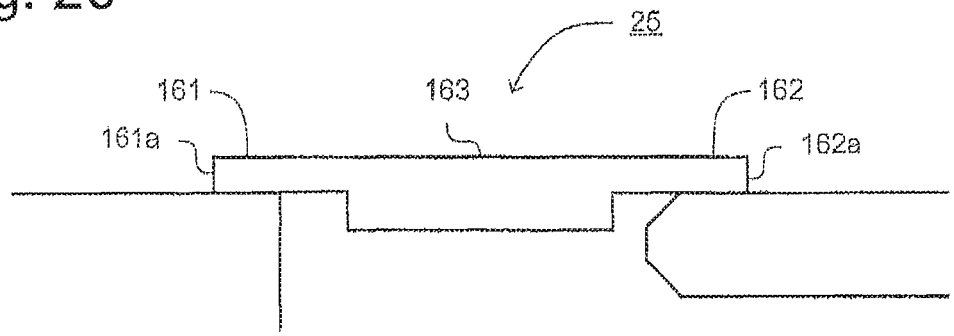
FIGS. 26 to 32 schematically depict, in cross section, arrangements of covers according to an aspect of the invention.
Figure 27:
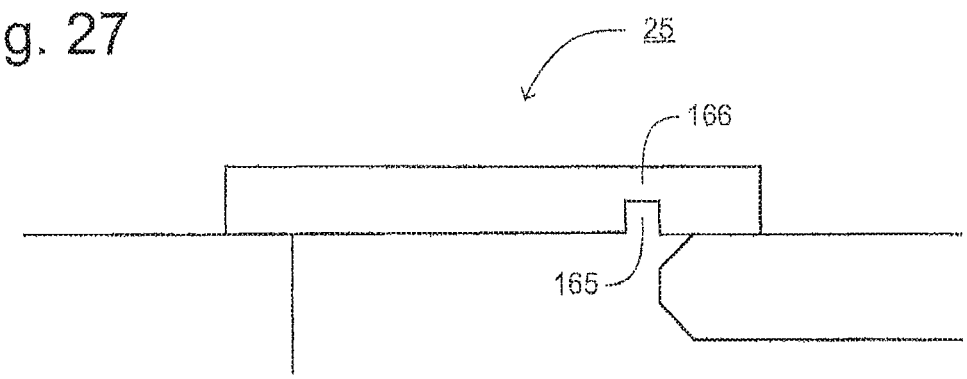
Figure 28:
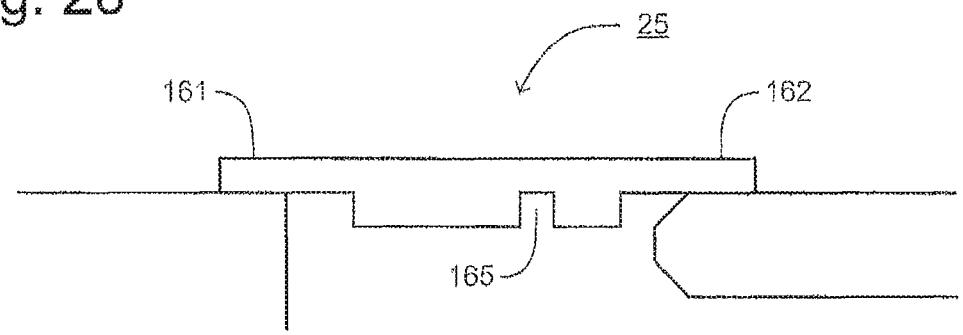

FIGS. 26 to 30 depict schematically, in cross-section, arrangements of covers 25 of an embodiment of the present invention having relatively flexible sections. As shown in FIGS. 26 to 28, a cover 25 may be formed from a single section of material and one or more relatively flexible sections may be provided in which the thickness of the cover is reduced. For example, as depicted in FIG. 26, one or more of the edge sections 161,162 of the cover 25 may have smaller thickness than the thickness of the remainder 163 of the main body of the cover 25. The sections 161,162 of reduced thickness will accordingly be less stiff than the remainder 163 of the main body of the cover 25.

The sections 161,162 of reduced thickness of the cover 25 may extend around the cover 25, for example along the entirety of the inside and/or outside edge of the cover 25. It will also be appreciated that in some arrangements, only one edge of the cover 25 will have a section of reduced thickness in order to provide a relatively flexible section.

It will be appreciated that such arrangements may be combined with embodiments discussed above in which the edge of the cover 25 is tapered. In this case, it will be appreciated that the edges 161a, 162a of the reduced thickness sections 161, 162 may be tapered. Similarly, the edges of the covers depicted in FIGS. 27 to 32, described below may be tapered. However, for brevity, this is not discussed in detail for each embodiment discussed below.

As depicted in FIG. 27, a relatively flexible section of the cover 25 may be provided by the formation of a groove 165 in the lower surface of the cover 25. The groove 165 results in an associated portion 166 of the cover 25 that has a reduced thickness and therefore reduced stiffness. It will be appreciated that the groove 165 may extend around the cover 25. Accordingly, in use, the groove 165 may be positioned above the gap between the edge of the substrate W and the edge of the recess in the substrate table WT, extending around the full periphery of the substrate.

Although FIG. 27 depicts an arrangement in which a single groove 165 is provided in the lower surface of the cover 25, it will be appreciated that a plurality of grooves may be provided in order to increase the flexibility of a section of the cover 25. However, in general, it is desirable to retain sufficient sections of the main body of the cover 25 with relatively high stiffness, namely sections of the cover having the full thickness, in order to help ensure that the cover 25 does not deform excessively in use.

As depicted in FIG. 28, the arrangements depicted in FIGS. 26 and 27 may be combined. In other words, a cover 25 may have a section of reduced thickness 161,162 at one or more of the edges of the cover 25 and may also be provided with one or more grooves 165 on the lower surface of the cover 25.

Figure 29:
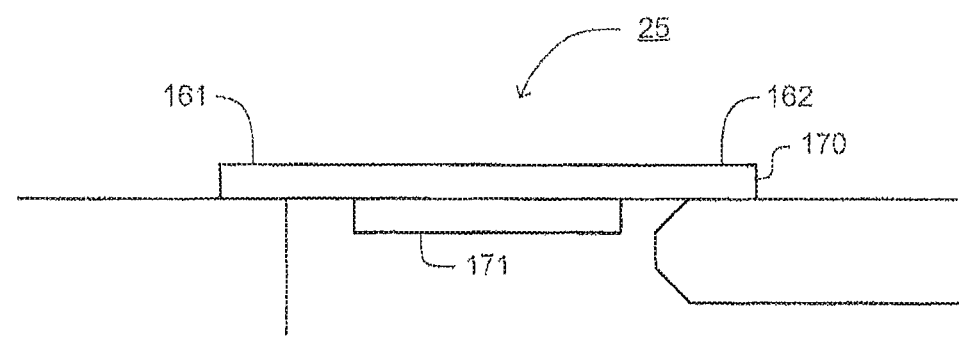
Figure 30:
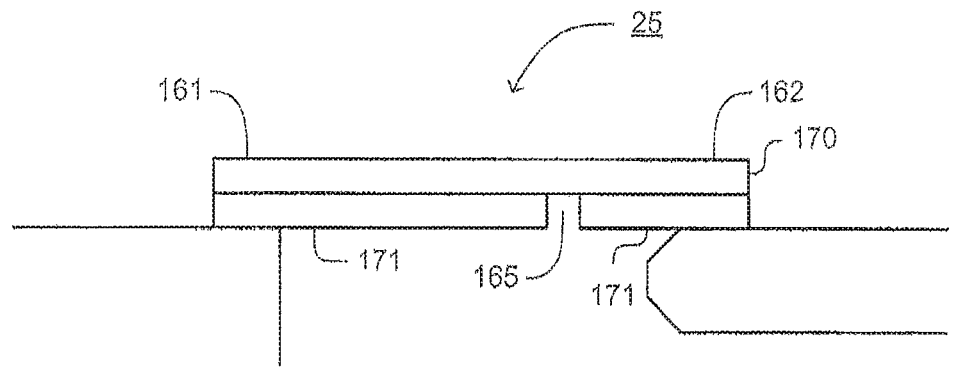
Figure 31:
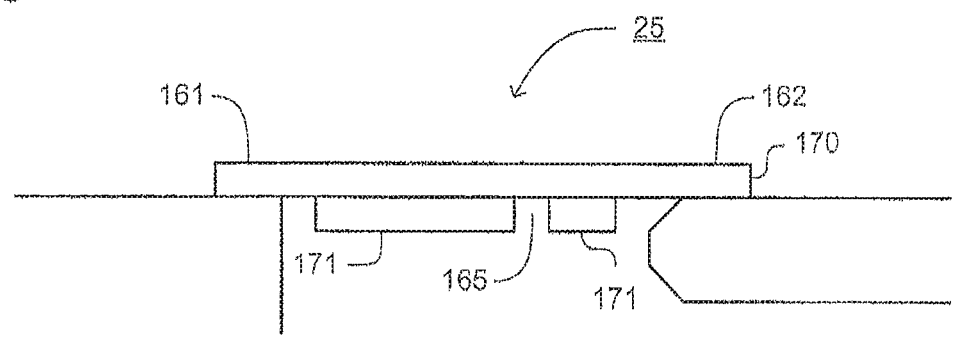

In corresponding further arrangements, as depicted in FIGS. 29 to 31 respectively, the main body of the cover 25 may be formed from a planar section of material 170 attached to at least one support section of material 171. The combination of the planar section of material 170 and the support section of material 171 provides sections of the main body of the cover 25 having full thickness and, accordingly, relatively high stiffness. Sections of the main body of the cover 25 that are formed from the planar material 170 that is not supported by support sections of material 171 provide sections of the cover 25 of reduced thickness 161,162 that have relatively low stiffness. Likewise, gaps between two support sections of material 171 provide grooves 165 that provide relatively flexible sections of the cover 25.

Although not depicted in FIGS. 26 to 31, it will be appreciated that the covers 25 of this aspect of the invention may include supports such as those discussed above, including supports to connect the cover 25 to an actuator system.

Figure 32:
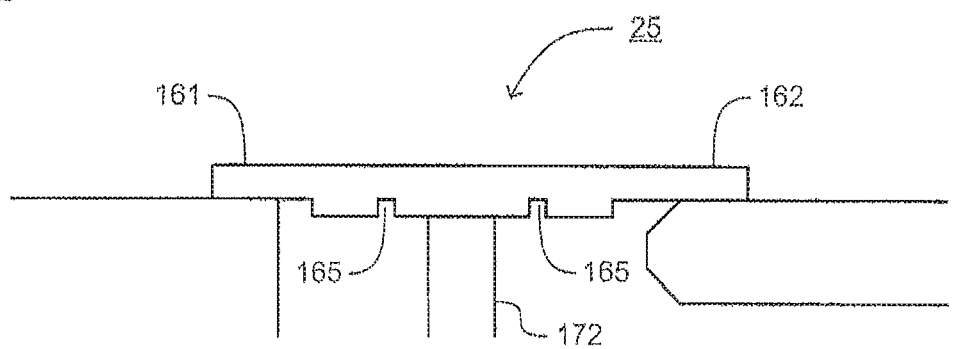

FIG. 32 depicts an embodiment of the present invention, in which the main body of the cover 25 is supported by one or more supports 172. As shown, the cover 25 has a reduced thickness section 161,162 at either edge of the cover 25, providing relatively flexible sections of the cover 25. In addition, grooves 165 are provided in the lower surface of the cover 25. The grooves 165 are positioned such that they each extend around the cover 25 in a position between a respective edge of the cover 25 and the position of the one or more supports 172. Accordingly, the grooves 165 provide additional relatively flexible sections of the cover 25. It will be appreciated that in variations of this arrangement, one or more of the relatively flexible sections of the cover 25 may be omitted.

In an embodiment, there is provided a lithographic apparatus comprising a substrate table having an upper surface and a recess in the upper surface that is configured to receive and support a substrate; a fluid handling structure configured to contain immersion fluid in a space adjacent to the upper surface of the substrate table and/or a substrate located in the recess; a cover comprising a planar main body that, in use, extends around a substrate from the upper surface to a peripheral section of an upper major face of the substrate in order to cover a gap between an edge of the recess and an edge of the substrate; and an immersion fluid film disruptor, configured to disrupt the formation of a film of immersion fluid between an edge of the cover and immersion fluid contained by the fluid handling structure during movement of the substrate table relative to the fluid handling structure.

In an embodiment, the immersion fluid film disruptor comprises an edge of the cover tapered such that the thickness of the cover gradually decreases across the edge. In an embodiment, the angle of the surface of the section of the cover that is tapered, relative to the upper major face of the substrate, is selected based on one or more selected from the following: intended speed of the substrate table in use relative to the fluid handling structure when a meniscus of the fluid is over the cover, dynamic contact angle of the fluid on the cover at the intended speed, and/or the dynamic contact angle of the fluid on the substrate at the intended speed. In an embodiment, the angle of the surface of the section of the cover that is tapered, relative to the upper major face of the substrate, is in the range of from about 15° to 45°. In an embodiment, the angle of the surface of the section of the cover that is tapered, relative to the upper major face of the substrate, is such that the dynamic contact angle of the fluid on the section of the cover when a meniscus of the fluid crosses the section of the cover in use less the angle of the surface of the section of the cover is greater than the dynamic contact angle of the fluid on the substrate in use. In an embodiment, the immersion fluid film disruptor comprises a surface profile formed on the edge, an upper surface of the cover, or both, the surface profile having a plurality of local variations in the surface. In an embodiment, the local variations include ridges, channels, pimples, dimples and/or other protrusions or recesses. In an embodiment, the immersion fluid film disruptor comprises a plurality of discrete gas jets formed on a surface of the fluid handling structure opposite the upper surface of the substrate and/or substrate table. In an embodiment, the gas jets are each configured to provide a jet of gas onto the film of immersion liquid as it forms. In an embodiment, the plurality of gas jets are provided by a corresponding plurality of apertures formed in the surface of the fluid handling structure. In an embodiment, the surface of the fluid handling structure comprises a line of openings, surrounding the space in which immersion fluid is contained, configured to extract immersion fluid in order to contain the immersion fluid in the space; and the plurality of gas jets are provided outwardly of the line of openings.

In an embodiment, there is provided a cover for use in an immersion lithographic apparatus that includes a substrate table having a substantially planar upper surface in which is formed a recess that is configured to receive and support a substrate, the cover comprising a substantially planar main body that, in use, extends around the substrate from the upper surface to a peripheral section of an upper major face of the substrate in order to cover a gap between an edge of the recess and an edge of the substrate, wherein the cover comprises an immersion fluid film disruptor configured to disrupt the formation of a film of immersion fluid between the edge of the cover and immersion fluid contained by a fluid handling structure of the immersion lithographic apparatus during movement of the substrate table relative to the fluid handling structure.

In an embodiment, there is provided a method of designing a cover for use in an immersion lithographic apparatus that includes a substrate table having a substantially planar upper surface in which is formed a recess that is configured to receive and support a substrate, the cover comprising a substantially planar main body that, in use extends around the substrate from the upper surface to a peripheral section of an upper major face of the substrate in order to cover a gap between an edge of the recess and an edge of the substrate, wherein an edge of the cover is tapered such that the thickness of the cover gradually decreases across the edge; and the method comprises selecting the angle of the surface of the section of the cover that is tapered, relative to the upper major face of the substrate, in order that the section of the cover in use disrupts the formation of a film of immersion fluid between the edge of the cover and the immersion fluid contained by a fluid handling structure of the lithographic apparatus during movement of the substrate table relative to the fluid handling structure.

In an embodiment, the angle of the surface of the section of the cover that is tapered, relative to the upper major face of the substrate, is selected based on one or more selected from the following: intended speed of the substrate table in use relative to the fluid handling structure when a meniscus of the fluid is over the cover, dynamic contact angle of the fluid on the cover at the intended speed, and dynamic contact angle of the fluid on the substrate at the intended speed. In an embodiment, the method further comprises forming the cover according to the design.

In an embodiment, there is provided a cover for use in an immersion lithographic apparatus, manufactured according to a design provided by a method of designing the cover for use in an immersion lithographic apparatus that includes a substrate table having a substantially planar upper surface in which is formed a recess that is configured to receive and support a substrate, the cover comprising a substantially planar main body that, in use extends around the substrate from the upper surface to a peripheral section of an upper major face of the substrate in order to cover a gap between an edge of the recess and an edge of the substrate, wherein an edge of the cover is tapered such that the thickness of the cover gradually decreases across the edge; and the method comprising selecting the angle of the surface of the section of the cover that is tapered, relative to the upper major face of the substrate, in order that the section of the cover in use disrupts the formation of a film of immersion fluid between the edge of the cover and the immersion fluid contained by a fluid handling structure of the lithographic apparatus during movement of the substrate table relative to the fluid handling structure.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

To operate one or more movements of a component of the present invention, such as an actuator, there may be one or controllers. The controllers may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

While specific embodiments of the invention have been described above, it will be appreciated that the invention may be practiced otherwise than as explicitly described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. The computer programs may be suitable for controlling a controller referred to herein.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a substrate table having a support surface configured to receive a substrate;
   a fluid handling member configured to contain immersion fluid in a space adjacent to the substrate table and/or adjacent to the substrate when received by the support surface; and
   a body of the substrate table located at an edge of the support surface, the body having an upper surface with a peripheral boundary and comprising a structure configured to disrupt an immersion fluid film, or its formation, between a part of the body and the immersion fluid contained by the fluid handling member during movement of the substrate table relative to the fluid handling member, wherein the structure comprises a surface profile formed on the upper surface, the surface profile comprising (a) a plurality of troughs, each trough having a surface of the structure at its bottom, or (b) a plurality of protrusions, or (c) both (a) and (b).

2. The lithographic apparatus of claim 1, wherein the structure is formed on the upper surface of the body and extends in an elongate manner along at least part of the edge of the support surface.

3. The lithographic apparatus of claim 1, wherein the structure comprises (a) the plurality of troughs along the peripheral boundary, or (b) the plurality of protrusions along the peripheral boundary, or (c) both (a) and (b).

4. The lithographic apparatus of claim 1, wherein the structure is formed in the peripheral boundary of the body.

5. The lithographic apparatus of claim 1, wherein the body surrounds the substrate when located on the substrate table.

6. The lithographic apparatus of claim 1, wherein at least part of the upper surface of the body at the structure is lyophobic.

7. The lithographic apparatus of claim 1, wherein at least part of an edge of the body at the peripheral boundary is tapered such that the thickness of the body gradually decreases in a direction towards the center of the support surface and across the edge of the body.

8. A substrate table for a lithographic apparatus, the substrate table comprising:
   a support surface configured to receive a substrate; and
   a body located at an edge of the support surface, the body having an upper surface with a peripheral boundary and comprising a structure configured to disrupt an immersion fluid film, or its formation, between a part of the body and immersion fluid contained by a fluid handling member of the lithographic apparatus during movement of the substrate table relative to the fluid handling member, wherein the fluid handling member is configured to contain the immersion fluid in a space adjacent to the substrate table and/or adjacent to the substrate when received by the support surface, wherein the structure comprises a surface profile formed on the upper surface, the surface profile comprising (a) a plurality of troughs, each trough having a surface of the structure at its bottom, or (b) a plurality of protrusions, or (c) both (a) and (b).

9. The substrate table of claim 8, wherein the structure is formed on the upper surface of the body and extends in an elongate manner along at least part of the edge of the support surface.

10. The substrate table of claim 8, wherein the structure comprises (a) the plurality of troughs along the peripheral boundary, or (b) the plurality of protrusions along the peripheral boundary, or (c) both (a) and (b).

11. The substrate table of claim 8, wherein the structure is formed in the peripheral boundary of the body.

12. The substrate table of claim 8, wherein the structure comprises a plurality of protrusions laterally extending from the peripheral boundary and/or recesses laterally extending into the peripheral boundary.

13. The substrate table of claim 8, wherein at least part of an edge of the body at the peripheral boundary is tapered such that the thickness of the body gradually decreases in a direction towards the center of the support surface and across the edge of the body.

14. The substrate table of claim 8, wherein at least part of the upper surface of the body at the structure is lyophobic.

15. A substrate table for a lithographic apparatus, the substrate table comprising:
a support surface configured to hold a substrate having a peripheral edge; and
a ring body having an inner peripheral edge conforming in shape with the peripheral edge of the substrate, the body having an upwardly-facing surface comprising a structure configured to disrupt an immersion fluid film, or its formation, between a part of the body and the immersion fluid contained by a fluid handling member of the lithographic apparatus during movement of the substrate table relative to the fluid handling member, wherein the fluid handling member is configured to contain the immersion fluid in a space adjacent to the substrate table and/or adjacent to the substrate when located on the support surface and wherein at least part of the upper surface of the body at the structure is lyophobic.

16. The substrate table of claim 15, wherein the structure extends in an elongate manner along at least part of the inner peripheral edge.

17. The substrate table of claim 15, wherein the structure comprises (a) a plurality of troughs, or (b) a plurality of protrusions, or both (a) and (b).

18. The substrate table of claim 15, wherein at least part of the inner peripheral edge is tapered such that the thickness of the body gradually decreases in a direction towards the center of the ring body and across the inner peripheral edge.

19. The substrate table of claim 18, wherein troughs and/or protrusions are formed in the tapered edge of the body.

20. The substrate table of claim 15, wherein the structure comprises a plurality of protrusions extending perpendicularly from the peripheral edge and/or recesses extending perpendicularly from the peripheral edge.

* * * * *